US011682827B2

(12) United States Patent
Kim et al.

(10) Patent No.: US 11,682,827 B2
(45) Date of Patent: *Jun. 20, 2023

(54) ANTENNA SYSTEM FOR TRANSMITTING AND RECEIVING MM-WAVE SIGNAL

(71) Applicant: SAMSUNG ELECTRONICS CO., LTD., Suwon-si (KR)

(72) Inventors: Ji Hoon Kim, Suwon-si (KR); Ji Yong Kim, Suwon-si (KR); Jong In Lee, Suwon-si (KR); Yeon Jeong Kim, Suwon-si (KR); Yong Jun An, Suwon-si (KR); Hyo Seok Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/693,501

(22) Filed: Mar. 14, 2022

(65) Prior Publication Data
US 2022/0216589 A1 Jul. 7, 2022

Related U.S. Application Data

(63) Continuation of application No. 16/202,596, filed on Nov. 28, 2018, now Pat. No. 11,283,151.

(30) Foreign Application Priority Data

Nov. 28, 2017 (KR) .................. 10-2017-0159884

(51) Int. Cl.
H01Q 1/24 (2006.01)
H01Q 1/22 (2006.01)
(Continued)

(52) U.S. Cl.
CPC ........... *H01Q 1/2283* (2013.01); *H01L 23/66* (2013.01); *H01P 5/187* (2013.01); *H01Q 1/24* (2013.01);
(Continued)

(58) Field of Classification Search
CPC .. H01Q 1/2283; H01Q 1/243; H01Q 21/0031; H01Q 23/00
See application file for complete search history.

(56) References Cited

U.S. PATENT DOCUMENTS 7,236,070 B2 6/2007 Ajioka et al.
8,164,396 B2 4/2012 Ishikawa et al.
(Continued)

FOREIGN PATENT DOCUMENTS

CN 1595649 A 3/2005
CN 102884731 A 1/2013
(Continued)

OTHER PUBLICATIONS

U.S. Appl. No. 16/202,596, filed Nov. 28, 2018; Kim et al.
(Continued)

*Primary Examiner* — Dieu Hien T Duong
(74) *Attorney, Agent, or Firm* — Nixon & Vanderhye P.C.

(57) ABSTRACT

Disclosed in an electronic device, which includes a housing that includes a first plate and a second plate facing a direction opposite the first plate, a conductive plate that is disposed in a first plane between the first plate and the second plate, and is parallel to the second plate, a wireless communication circuit that is disposed within the housing and is configured to transmit and/or receive a signal having a frequency ranging from 20 GHz to 100 GHz, a first electrical path having a first end electrically connected with the wireless communication circuit and a second end floated, the first electrical path including a first portion between the (Continued)

first end and the second end, a second electrical path having a third end electrically connected with the conductive plate and a fourth end floated, the second electrical path including a second portion between the third end and the fourth end.

20 Claims, 18 Drawing Sheets

(51) Int. Cl.
*H01Q 23/00* (2006.01)
*H01Q 21/00* (2006.01)
*H01Q 9/04* (2006.01)
*H01L 23/66* (2006.01)
*H01P 5/18* (2006.01)
*H01Q 5/335* (2015.01)
*H01Q 21/06* (2006.01)

(52) U.S. Cl.
CPC ............ *H01Q 1/243* (2013.01); *H01Q 5/335* (2015.01); *H01Q 9/0407* (2013.01); *H01Q 9/0414* (2013.01); *H01Q 21/0031* (2013.01); *H01Q 21/0093* (2013.01); *H01Q 21/065* (2013.01); *H01Q 23/00* (2013.01); *H01L 2223/6627* (2013.01); *H01L 2223/6677* (2013.01)

(56) References Cited

U.S. PATENT DOCUMENTS

| | | | |
|---|---|---|---|
| 8,854,265 | B1 | 10/2014 | Yang |
| 9,491,860 | B2 | 11/2016 | Akahoshi |
| 9,570,809 | B2 | 2/2017 | Ganchrow et al. |
| 9,653,818 | B2 | 5/2017 | Mohammadian et al. |
| 9,655,231 | B2 | 5/2017 | Hidaka |
| 9,692,126 | B2 | 6/2017 | Sharawi |
| 9,773,742 | B2 | 9/2017 | Kamgaing et al. |
| 9,806,789 | B2 | 10/2017 | Khan et al. |
| 9,859,861 | B2 | 1/2018 | Murata |
| 10,062,954 | B2 | 8/2018 | Hong et al. |
| 10,079,428 | B2 | 9/2018 | Nissinen et al. |
| 10,128,177 | B2 | 11/2018 | Kamgaing et al. |
| 10,249,930 | B2 | 4/2019 | Srirattana et al. |
| 10,658,312 | B2 | 5/2020 | Kamgaing et al. |
| 11,283,151 | B2 * | 3/2022 | Kim .................. H01Q 9/0414 |
| 2004/0012467 | A1 | 1/2004 | Salmela et al. |
| 2005/0088260 | A1 | 4/2005 | Ajioka et al. |
| 2009/0237182 | A1 | 9/2009 | Chung et al. |
| 2010/0225545 | A1 | 9/2010 | Tamura et al. |
| 2010/0283544 | A1 | 11/2010 | Ishikawa et al. |
| 2013/0147664 | A1 | 6/2013 | Lin |
| 2013/0194754 | A1 | 8/2013 | Jung et al. |
| 2014/0145883 | A1 | 5/2014 | Baks et al. |
| 2014/0210675 | A1 | 7/2014 | Hwang |
| 2014/0253393 | A1 | 9/2014 | Nissinen et al. |
| 2015/0000967 | A1 | 1/2015 | Akahoshi |
| 2015/0325925 | A1 | 11/2015 | Kamgaing et al. |
| 2015/0349421 | A1 | 12/2015 | Sharawi |
| 2016/0020165 | A1 | 1/2016 | Kamgaing et al. |
| 2016/0118951 | A1 | 4/2016 | Murata |
| 2017/0117635 | A1 | 4/2017 | Ganchrow et al. |
| 2017/0223823 | A1 | 8/2017 | Hidaka |
| 2017/0256843 | A1 | 9/2017 | Hu |
| 2017/0279197 | A1 | 9/2017 | Sharawi |
| 2017/0294705 | A1 | 10/2017 | Khripkov et al. |
| 2017/0317396 | A1 | 11/2017 | Srirattana et al. |
| 2018/0012852 | A1 | 1/2018 | Kamgaing et al. |
| 2018/0084637 | A1 | 3/2018 | Ueda |
| 2018/0197829 | A1 | 7/2018 | Stiebler |
| 2018/0337456 | A1 | 11/2018 | Liu et al. |
| 2019/0221937 | A1 | 7/2019 | Onaka |

FOREIGN PATENT DOCUMENTS

| | | |
|---|---|---|
| CN | 106165195 A | 11/2013 |
| CN | 104867912 A | 8/2015 |
| CN | 105393403 A | 3/2016 |
| CN | 107278342 A | 10/2017 |
| JP | 2002-271216 | 9/2002 |
| JP | 2015-012208 | 1/2015 |
| JP | 2017-514317 | 6/2017 |
| KR | 10-2015-0108147 | 9/2015 |
| WO | 2008/018338 | 2/2008 |
| WO | 2017/128872 | 8/2017 |

OTHER PUBLICATIONS

Chinese Office Action dated Sep. 27, 2020 for CN Application No. 201880075560.X.
Chinese Office Action dated May 28, 2021 for CN Application No. 201880075560.X.
International Search Report and Written Opinion dated Mar. 6, 2019 in counterpart International Patent Application No. PCT/KR2018/014834.
Extended Search Report dated Apr. 23, 2019 in counterpart European Patent Application No. 18208925.0.
Notice of Rejection dated Oct. 1, 2019 in counterpart Japanese Patent Application No. 2018-222896.
Korean Notice of Allowance dated Mar. 25, 2022 for KR Application No. KR 10-2017-0159884.
Chinese Reexamination Notification dated Oct. 27, 2022 for CN Application No. 201880075560.X.
Chinese Reexamination Decision dated Jan. 18, 2023 for CN Application No. 201880075560.X.

* cited by examiner

ANTENNA SYSTEM FOR TRANSMITTING AND RECEIVING MM-WAVE SIGNAL

CROSS-REFERENCE TO RELATED APPLICATION

This application is a Continuation of U.S. application Ser. No. 16/202,596, filed Nov. 28, 2018 (now U.S. Pat. No. 11,283,151), which claims priority to KR 10-2017-0159884, filed on Nov. 28, 2017, the entire contents of which are all hereby incorporated herein by reference in their entireties.

BACKGROUND

1. Field

The present disclosure relates to a technology associated with a communication device for transmitting/receiving a millimeter wave signal.

2. Description of Related Art

In an electronic device transmitting data using wireless communication, a signal in a high frequency band of 20 GHz or higher may be used to transmit or receive a large amount of data such as a high-definition image, a high-quality sound, a high-definition video, or the like.

The electronic device may use a component formed of a conductive material as an antenna radiator for the purpose of transmitting or receiving a signal in a low frequency band, but may use an antenna module separately configured to transmit or receive a signal in a high frequency band. The antenna module may be implemented in such a way that a radio frequency integrated circuit (RFIC) for transmitting/receiving a signal is mounted on a printed circuit board (PCB).

The above information is presented as background information only to assist with an understanding of the present disclosure. No determination has been made, and no assertion is made, as to whether any of the above might be applicable as prior art with regard to the present disclosure.

In the case where an antenna array for transmitting or receiving a signal in a specified frequency band is implemented with an antenna PCB including a plurality of layers, it may be difficult to place a component for controlling a transmit or receive signal at the antenna PCB. As such, a separate component for controlling the transmit signal or the receive signal may be positioned at a main PCB 130 (refer to FIG. 1), thereby causing an inefficient use of a limited space of the main PCB 130.

SUMMARY

The present disclosure addresses at least the above-mentioned problems and/or disadvantages and provides at least the advantages described below. Accordingly, an aspect of the present disclosure is to provide an electronic device which filters a signal in a specified frequency band using a feed line and a conductive line in an antenna PCB or changes a signal in a frequency band to be transmitted or received.

In accordance with an aspect of the present disclosure, an electronic device may include a housing that includes a first plate and a second plate facing a direction opposite the first plate, a conductive plate positioned in a first plane between the first plate and the second plate, and parallel to the second plate, a wireless communication circuit disposed within the housing and configured to transmit and/or receive a signal having a frequency ranging from 20 GHz to 100 GHz, a first electrical path having a first end electrically connected with the wireless communication circuit and a second end floated, the first electrical path including a first portion between the first end and the second end, a second electrical path having a third end electrically connected with the conductive plate and a fourth end floated, the second electrical path including a second portion between the third end and the fourth end. The first portion and the second portion may extend in parallel with each other and may provide electrical coupling between the first portion and the second portion.

In accordance with another aspect of the present disclosure, a millimeter wave communication device may include an antenna printed circuit board (PCB) including a plurality of layers, an integrated circuit (IC) disposed under the antenna PCB, a first feed line electrically connected with the IC and extending to a first layer through one or more of the plurality of layers of the antenna PCB, a first portion of the first feed line disposed in the first layer and having a first length, a second feed line spaced from the first portion of the first feed line and disposed in a second layer of the antenna PCB, the second layer being an upper layer of the first layer, so as to be electrically coupled with the first portion of the first feed line, and a first antenna element electrically connected with the second feed line in a third layer of the antenna PCB, the third layer being an upper layer of the second layer. The IC may transmit and/or receive a millimeter wave (mm-wave) signal using the first feed line, the second feed line, and the first antenna element.

In accordance with another aspect of the present disclosure, a millimeter wave communication device may include an antenna printed circuit board (PCB) including a plurality of layers, an integrated circuit (IC) disposed under the antenna PCB, and a first feed line electrically connected with the IC and extending to a first layer through one or more of the plurality of layers of the antenna PCB, a first portion of the first feed line being disposed in the first layer and having a first length, a second feed line that is disposed to be coupled with the first portion, and is disposed in the first layer of the first feed line in the first layer, and an antenna element electrically connected with the second feed line in a second layer of the antenna PCB, the second layer being an upper layer of the first layer. The IC may transmit and/or receive a millimeter wave (mm-wave) signal using the first feed line, the second feed line, and the antenna element.

According to embodiments of the present disclosure, a communication device for transmitting/receiving a millimeter wave signal may efficiently use a space of a printed circuit board (PCB) without a separate component(s) for controlling a transmit and/or receive signal, by making feed lines positioned in layers of the PCB coupled to each other such that a power is supplied to an antenna element through feed and conductive lines, and by filtering the transmit and/or receive signal.

Also, as an open stub may be formed at a conductive line connected to an antenna element or a variable capacitor is installed at the conductive line, the communication device may easily control a transmit signal or a receive signal.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Hereinafter, various example embodiments of the present disclosure will be described with reference to accompanying drawings. However, those of ordinary skill in the art will recognize that various modifications, equivalents, and/or alternatives of the various example embodiments described herein may be variously made without departing from the scope and spirit of the present disclosure.

Figure 1:
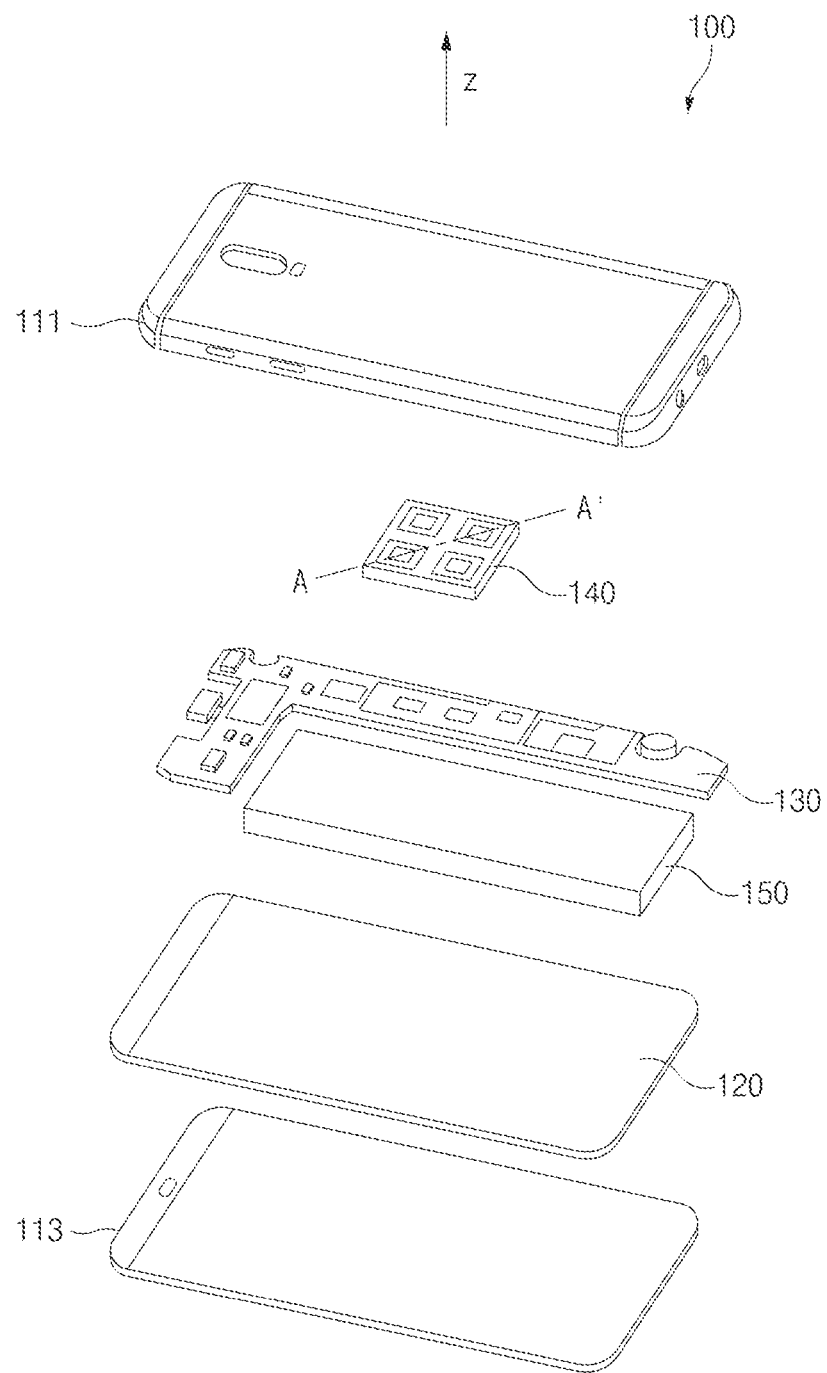
FIG. 1 is an exploded perspective view illustrating components of an electronic device according to various embodiments.

FIG. 1 is an exploded perspective view illustrating components of an electronic device according to various embodiments.

Referring to FIG. 1, an electronic device 100 may include a rear cover 111 (e.g., a second plate), a cover glass 113 (e.g., a first plate), a display 120, a main printed circuit board (PCB) 130, a communication device (e.g., including communication circuitry) 140, and a battery 150.

According to an embodiment, the rear cover 111 may form the exterior of the electronic device 100. According to an embodiment, the rear cover 111 may, for example, be formed of tempered glass, plastic, and/or metal and may protect various parts (e.g., the display 120 and the main PCB 130) mounted within the electronic device 100 from external impact. According to an embodiment, the rear cover 111 may be integrally implemented with the cover glass 113 or may be implemented to be removable.

According to an embodiment, the cover glass 113 may transmit a light generated by the display 120. According to an embodiment, a user may touch a portion (e.g., a finger) of his/her body on the cover glass 113 to perform a touch input (including a contact using an electronic pen). According to an embodiment, the cover glass 113 may be formed of tempered glass, reinforced plastic, a flexible polymer material, or the like.

According to an embodiment, the rear cover 111 and the cover glass 113 facing away from (e.g., a direction opposite) the rear cover 111 may form a housing of the electronic device 100. Components (e.g., the display 120, the main PCB 130, the communication device 140, and the battery 150) included in the electronic device 100 may be positioned within the housing and may be protected from external impact.

According to an embodiment, the display 120 may be interposed between the cover glass 113 and the main PCB 130. According to an embodiment, the display 120 may be electrically connected with the main PCB 130 to output content (e.g., a text, an image, a video image, or the like). According to an embodiment, the display 120 may include a touch panel, and may receive a touch input (e.g., a touch, a gesture, a hovering, or the like) from the user through the touch panel.

According to an embodiment, various electronic parts, various elements, various integrated circuits, or the like of the electronic device 100 may be mounted on the main PCB 130. For example, an application processor (AP), a communication processor (CP), a memory, or the like may be mounted on the main PCB 130. According to an embodiment, the main PCB 130 may transmit/receive a specified signal through the communication device 140. According to an embodiment, the main PCB 130 may display an image included in the received signal through the display 120.

According to an embodiment, the communication device 140 may include various communication circuitry and communicate with an external device. For example, the communication device 140 may transmit data to an electronic device of any other user, may receive data from an electronic device of any other user, or the like. According to an embodiment, the communication device 140 may be connected with the main PCB 130 and may transmit/receive a signal in a specified frequency band. For example, and without limitation, the communication device 140 may transmit and/or receive a signal in a millimeter frequency band of 26 GHz, 28 GHz, 39 GHz, 60 GHz, or the like.

According to an embodiment, the communication device 140 may include an antenna printed circuit board (PCB). For example, the communication device 140 may include an antenna PCB which includes a communication IC for transmitting/receiving a signal, an antenna element, and/or a feed line electrically connecting the communication IC and the antenna element. For example, the antenna PCB may include one layer or may include of a plurality of layers. In the case where the antenna PCB includes a plurality of layers, at least a portion of the feed line may be formed between the plurality of layers. According to an embodiment, the communication device 140 may include a plurality of antenna elements for transmitting and/or receiving a specified signal. For example, the communication device 140 may include one antenna array including a plurality of antenna elements. According to an embodiment, the communication device 140 may transmit and/or receive a signal in a specified direction. For example, the communication device 140 may transmit/receive a signal toward the rear cover 111 (or in a z direction). For example, the communication device 140 may transmit and/or receive a signal for 5th generation (5G) communication (e.g., a signal in a frequency band ranging from 26 GHz to 28 GHz, ranging from 39 GHz to 40 GHz, a signal in a frequency band of 60 GHz, or the like).

According to an embodiment, the communication device 140 may be interposed between the rear cover 111 and the cover glass 113. For example, the communication device 140 may be positioned at a corner portion of the rear cover 111. For example, a plurality of communication devices 140 (e.g., four communication devices 140) may be positioned at respective corners. Each of the plurality of communication devices 140 may include, for example, an antenna array including a plurality of antenna elements.

According to an embodiment, the battery 150 may be interposed between the rear cover 111 and the display 120. According to an embodiment, the battery 150 may supply electrical energy to the display 120 and the main PCB 130. For example, the battery 150 may convert chemical energy to electrical energy and may supply the converted electrical energy to the display 120 and the main PCB 130. According to an embodiment, the battery 150 may convert and store electrical energy supplied from the outside to chemical energy. For example, the battery 150 may be a secondary cell which may be rechargeable.

A millimeter wave communication device according to various example embodiments of the present disclosure may filter a signal in a specified frequency band using a feed line and a conductive line in a PCB or may change a signal in a frequency band to be transmitted or received.

In the present disclosure, the description given with reference to FIG. 1 may be applied to components having the same reference numerals/marks as the components of the electronic device 100 described with reference to FIG. 1.

Figure 2:
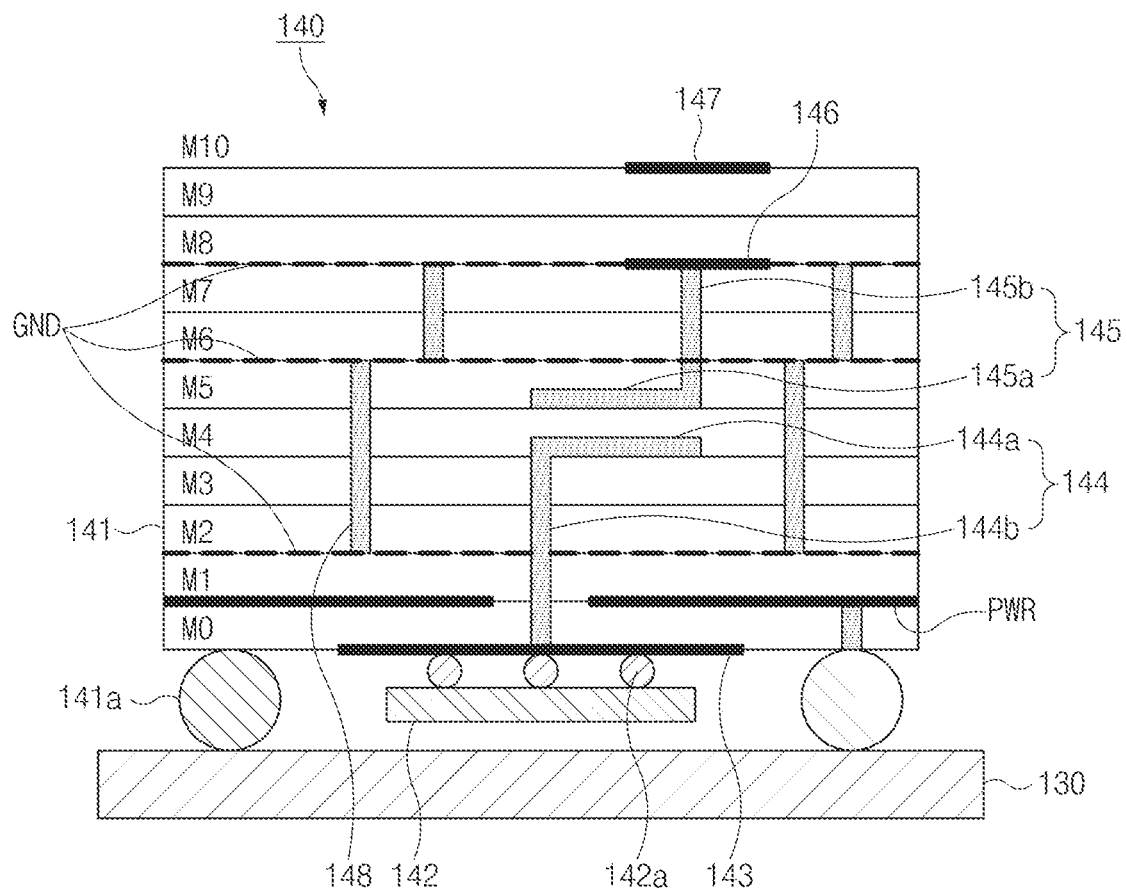
FIG. 2 is a sectional view illustrating a communication device according to an embodiment.

FIG. 2 is a sectional view illustrating a communication device according to an embodiment.

Referring to FIG. 2, the electronic device 100 may include the communication device 140 for receiving a signal in a specified frequency band. The communication device 140 may include an antenna array.

According to an embodiment, the communication device 140 may include an antenna PCB 141, a communication IC 142, a radio frequency (RF) interface 143, a first feed line 144, a second feed line 145, an antenna element 146 (e.g., an antenna patch), and a parasitic antenna element 147 (e.g., a parasitic antenna patch).

According to an embodiment, the antenna PCB 141 may include a plurality of layers M0 to M10. Components included in the communication device 140 may be positioned in the plurality of layers M0 to M10. According to an embodiment, the antenna PCB 141 may be electrically connected with the main PCB 130. For example, the antenna PCB 141 may be electrically connected with the main PCB 130 through a ball grid array (BGA) 141a. For another example, the antenna PCB 141 may be electrically connected with the main PCB 130 through a board to board (BtoB) connector.

According to an embodiment, the communication IC 142 may be positioned on a first surface of the antenna PCB 141, which faces the main PCB 130. For example, the communication IC 142 may be positioned on the first surface of the antenna PCB 141 using a solder ball 142a. For another example, the communication IC 142 may be positioned on the first surface of the antenna PCB 140 through flip chip bonding or wire bonding. According to an embodiment, the communication IC 142 may be interposed between the antenna PCB 141 and the main PCB 130.

According to an embodiment, the communication IC 142 may transmit and/or receive a signal in a specified frequency band. For example, the communication IC 142 may transmit and/or receive a signal in a frequency band ranging from 20 GHz to 100 GHz.

According to an embodiment, the communication IC 142 may be supplied with a power from the main PCB 130. For example, the communication IC 142 may be supplied with the power for operation from the main PCB 130 through the BGA 141a, the solder ball 142a, and a power line PWR. For example, the power line PWR may be formed in the second layer M1 of the antenna PCB 141. According to an embodiment, the communication IC 142 may supply the communication device 140 with a current for transmitting and/or receiving a signal in a specified frequency band using the supplied power.

According to an embodiment, the RF interface 143 may be formed in the first layer M0 of the antenna PCB 141. According to an embodiment, the communication IC 142 may be coupled with the RF interface 143. The communication IC 142 may supply a current to the communication device 140 through the RF interface 143.

According to an embodiment, the first feed line 144 may be electrically connected with the communication IC 142. For example, the first feed line 144 may be electrically connected with the communication IC 142 through the RF interface 143. According to an embodiment, the first feed line 144 may extend to a specified layer through one or more of the layers of the antenna PCB 141, and a first portion 144a of the first feed line 144 may be positioned in the specified layer and have a first length. For example, the first feed line 144 may be extended to the fifth layer M4 through the first layer M0 to the fourth layer M3, and the first portion 144a of the first feed line 144 may be formed in the fifth layer M4 with the first length.

According to an embodiment, the second feed line 145 may be positioned in an upper layer with respect to the layer, in which the first portion 144a of the first feed line 144 is positioned, of the antenna PCB 141, and be coupled with the first portion 144a of the first feed line 144. For example, a second portion 145a of the second feed line 145 may be positioned in the sixth layer M5 with a second length and be coupled with the first portion 144a of the first feed line 144. The second length may be identical to the first length of the first portion 144a of the first feed line 144 positioned in the fifth layer M4. The second feed line 145 may be positioned to be physically spaced from the first feed line 144. According to an embodiment, when the first portion 144a of the first feed line 144 and the second portion 145a of the second feed line 145 are coupled, the current supplied from the communication IC 142 may be transferred to the antenna element 146. For another example, the first portion 144a of the first feed line 144 and the second portion 145a of the second feed line 145 thus coupled may filter a transmit signal or a receive signal in a specified frequency band.

According to an embodiment, the second feed line 145 may be electrically connected with the antenna element 146. For example, the second feed line 145 may be electrically connected with the antenna element 146 through one or more layers (e.g., M5 to M7). As such, the second feed line 145 may transmit a signal output from the communication IC 142 or may transmit a signal received through the antenna element 146.

According to an embodiment, the antenna element 146 may be positioned on an upper layer of the antenna PCB 141 with respect to the layer in which the second feed line 145 is positioned. For example, the antenna element 146 may be positioned in the ninth layer M8. According to an embodiment, the antenna element 146 may include an electrical path for transmitting and/or receiving a signal in a specified frequency band. The antenna element 146 may form an electrical path by a current supplied from the communication IC 142 to the second feed line 145 through the electrical path.

According to an embodiment, the parasitic antenna element 147 may be positioned in a layer above the layer in which the antenna element 146 is positioned. According to an embodiment, the parasitic antenna element 147 may form a directivity of a signal which is transmitted and/or received through the electrical path formed in the antenna element 146. For example, the parasitic antenna element 147 may form an electric field by the electrical path in the positioned direction. According to another embodiment, in the case where the parasitic antenna element 147 is not included in the communication device 140, the antenna element 146 may be positioned in the uppermost layer.

According to an embodiment, the antenna PCB 141 may include one or more ground layers. For example, a ground GND may be formed in one or more layers among the layers included in the antenna PCB 141. For example, the ground GND may be formed in each of the third layer M2, the seventh layer M6, and the ninth layer M8 of the antenna PCB 141. According to an embodiment, the plurality of grounds GND formed in the antenna PCB 141 may be electrically connected to each other through a via(s) 148. The via 148 may be formed to penetrate one or more of the layers of the antenna PCB 141, for example. According to an embodiment, the via 148 formed to penetrate the one or more layers may block interference of a signal which is transmitted and/or received through any other antenna included in the communication device 140.

According to an embodiment, the communication IC 142 of the communication device 140 may transmit and/or receive a millimeter wave (mm-wave) signal in a specified frequency band through the first feed line 144, the second feed line 145, and the antenna element 146.

According to another embodiment, a first end of a first electrical path formed by the first feed line 144 positioned in the antenna PCB 141 may be electrically connected with the communication IC 142, and a second end thereof may be floated. The first electrical path may include the first portion 144a between the first end and the second end. The first electrical path may include a third portion 144b which penetrates a part of a plurality of layers of the antenna PCB 141 and electrically connects the communication IC 142 and the first portion 144a. The third portion 144b may be implemented with, for example, a first conductive via formed to penetrate a part of the plurality of layers. The first conductive via may electrically connect the communication IC 142 and the first portion 144a.

According to another embodiment, a first end of a second electrical path formed by the second feed line 145 positioned in the antenna PCB 141 may be electrically connected with the antenna element 146, and a second end thereof may be floated. The second electrical path may include the second portion 145a between the first end and the second end. The second electrical path may include a fourth portion 145b which penetrates a part of the plurality of layers of the antenna PCB 141 and electrically connects the antenna element 146 and the second portion 145a. The fourth portion 145b may be implemented with, for example, a second conductive via formed to penetrate a part of the plurality of layers. The second conductive via may electrically connect the antenna element 146 and the second portion 145a.

According to an embodiment, the first portion 144a and the second portion 145a may extend in parallel with each other, and may provide electrical coupling between the first portion 144a and the second portion 145a. For example, the first portion 144a and the second portion 145a thus coupled may filter a portion of a signal which is transmitted and/or received through the antenna element 146.

According to an embodiment, the antenna element 146 (or a conductive plate) may be positioned in a first plane between the rear cover 111 (or a second plate) and the cover glass 113 (or a first plate), and may be parallel to the rear cover 111. According to an embodiment, the communication IC 142 may be parallel to the rear cover 111 and may be positioned in a second plane between the first plane and the cover glass 113. According to an embodiment, the antenna PCB 141 may include a first surface (e.g., the first layer M0) facing the cover glass 113, a second surface (e.g., the eleventh layer M10) facing the rear cover 111, and a plurality of insulating layers between the first surface and the second surface.

According to an embodiment, the communication IC 142 may be mounted on the first surface.

According to an embodiment, the plurality of layers may include, for example, a first layer (e.g., the sixth layer M5), a second layer (e.g., one of the second to fifth layers M1 to M4) between the first layer and the first surface, and a third layer (e.g., one of the seventh to tenth layers M6 to M9) between the first layer and the second surface. According to an embodiment, the first portion 144a of the first feed line 144 may be inserted between the first layer and the second layer (e.g., in the fifth layer M4), and the second portion 145a of the second feed line 145 may be inserted between the first layer and the third layer (e.g., in the sixth layer M5). According to an embodiment, the antenna element 146 may be inserted between the third layer and the second surface (e.g., in the ninth layer M8).

Figure 3A:
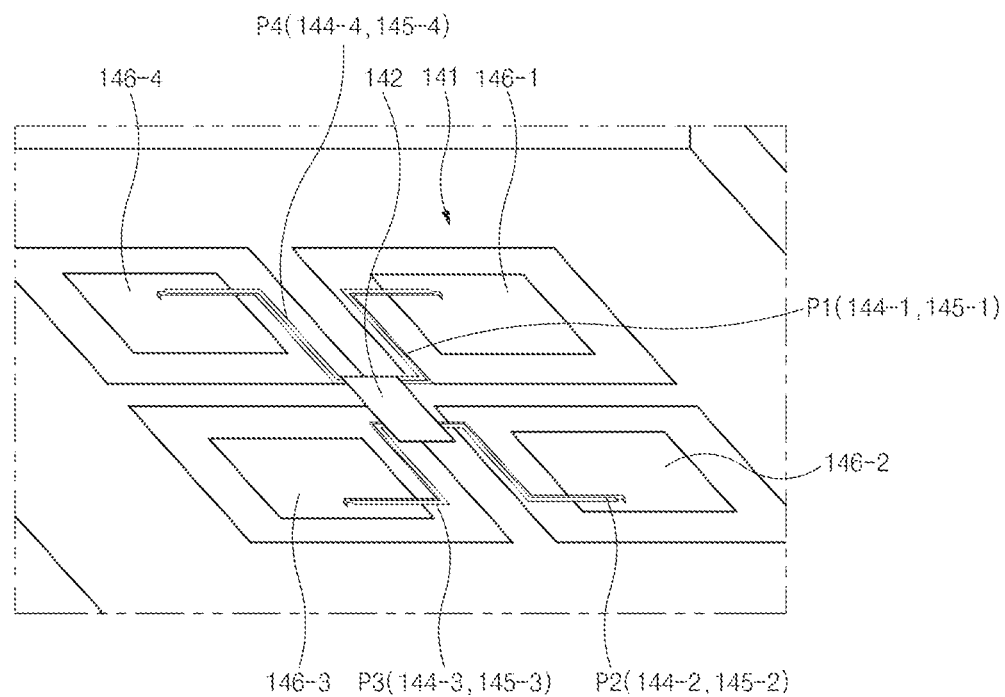
FIGS. 3A and 3B are perspective views illustrating a millimeter wave communication device including a plurality of antenna elements according to an embodiment.
Figure 3B:
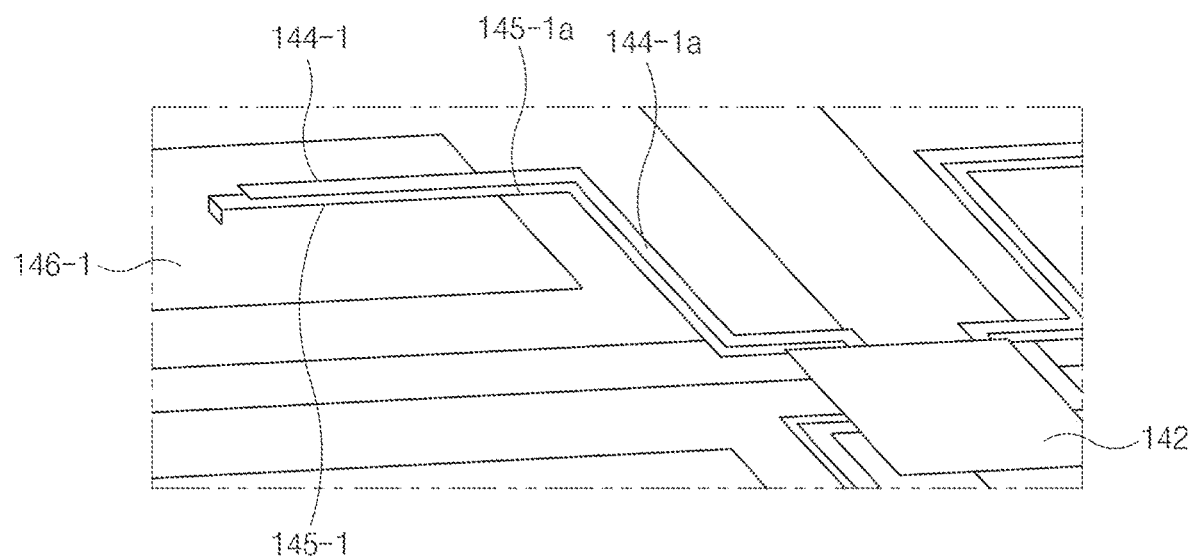

FIGS. 3A and 3B are perspective views illustrating a millimeter wave communication device including a plurality of antenna elements according to an embodiment.

Referring to FIG. 3A, the communication device 140 may include a plurality of antenna elements. For example, the communication device 140 may include a plurality of ports which may transfer a signal output from the communication IC 142 or a signal received through the plurality of antenna elements.

According to an embodiment, the communication device 140 may include a first antenna element 146-1, a second antenna element 146-2, a third antenna element 146-3, and a fourth antenna element 146-4. The first to fourth antenna elements 146-1 to 146-4 may be identical or similar to the antenna element 146 of FIG. 2.

According to an embodiment, the first to fourth antenna elements 146-1 to 146-4 of the communication device 140 may be positioned in the same layer. According to an embodiment, the first to fourth antenna elements 146-1 to 146-4 may be positioned with respect to the communication IC 142. According to an embodiment, the first to fourth antenna elements 146-1 to 146-4 may be positioned to be physically separated from each other. For example, the first to fourth antenna elements 146-1 to 146-4 may be positioned to be separated from each other by a specified interval (or distance) with respect to the communication IC 142.

According to an embodiment, the communication device 140 may include the antenna PCB 141 and the communication IC 142. According to an embodiment, the communication device 140 may include a first port P1, a second port P2, a third port P3, and a fourth port P4, which are used to transfer a signal output from the communication IC 142 and/or a signal received through the first to fourth antenna elements 146-1 to 146-4. For example, the communication device 140 may include the first to fourth ports P1 to P4 each including a first feed line and a second feed line. For example, the communication device 140 may include four first feed lines 144-1, 144-2, 144-3, and 144-4 and four second feed lines 145-1, 145-2, 145-3, and 145-4. To transmit a signal output from the communication IC 142 and/or a signal received through the first to fourth antenna elements 146-1 to 146-4, the four first feed lines 144-1, 144-2, 144-3, and 144-4 may be positioned to be similar to the first feed line 144 of FIG. 2, and the four second feed lines 145-1, 145-2, 145-3, and 145-4 may be positioned to be similar to the second feed line 145 of FIG. 2. As such, a portion (or a signal filtering portion) where the first feed line 144-1, 144-2, 144-3, or 144-4 and the second feed line 145-1, 145-2, 145-3, or 145-4 are coupled may be formed at the port P1, P2, P3, or P4 of the communication device 140. The communication device 140 may transmit/receive a signal in a specified frequency band through the first to fourth antenna elements 146-1 to 146-4 using the first feed lines 144-1, 144-2, 144-3, and 144-4 and the second feed lines 145-1, 145-2, 145-3, and 145-4.

According to another embodiment, at least one of a plurality of ports respectively connected with a plurality of antenna elements of the communication device 140 may not be electrically connected with an antenna element. For example, a second feed line of the communication device 140 may not be connected with an antenna element, and thus, a port may not be connected with the antenna element. The port which is not connected with the antenna element may be maintained, for example, at an open state. For another example, the port which is not connected with the antenna element may be connected to a ground. As such, a frequency band of a signal which the communication device 140 transmits and/or receives may be changed.

Below, the communication IC 142 will be described with reference to the first feed line 144-1 and the second feed line 145-1 connected to the first antenna element 146-1. A description which will be given with reference to the first antenna element 146-1 may be identically or similarly applied to the second antenna element 146-2, the third antenna element 146-3, and the fourth antenna element 146-4.

Referring to FIG. 3B, the first feed line 144-1 and the second feed line 145-1 may be coupled.

According to an embodiment, the first feed line 144-1 may be electrically connected to the communication IC 142. The second feed line 145-1 may be electrically connected to the first antenna element 146-1.

According to an embodiment, a first portion 144-1a of the first feed line 144-1 may be positioned in a first layer (e.g., the fifth layer M4) of the antenna PCB 141. According to an embodiment, a second portion 145-1a of the second feed line 145-1 may be positioned in a second layer (e.g., the sixth layer M5) being an upper layer of the first layer. According to an embodiment, the first portion 144-1a of the first feed line 144-1 and the second portion 145-1a of the second feed line 145-1 may be positioned parallel to each other. For example, the first portion 144-1a of the first feed line 144-1 and the second portion 145-1a of the second feed line 145-1 may at least partially overlap each other when viewed from above the antenna PCB 141. As such, the first portion 144-1a of the first feed line 144-1 and the second portion 145-1a of the second feed line 145-1 may be coupled.

According to an embodiment, a power supplied from the communication IC 142 may be transmitted to the first antenna element 146-1 through the first feed line 144-1 and the second feed line 145-1 physically separated from the first feed line 144-1. According to an embodiment, the coupled portions of the first feed line 144-1 and the second feed line 145-1, that is, the first portion 144-1a and the second portion 145-1a may filter a signal in a specified frequency band. For example, the first portion 144-1a and the second portion 145-1a thus coupled may filter at least a portion of a signal which is transmitted and/or received through the first antenna element 146-1. According to an embodiment, a frequency band to be filtered may be determined according to a length of the first portion 144-1a and the second portion 145-1a thus coupled.

Figure 4:
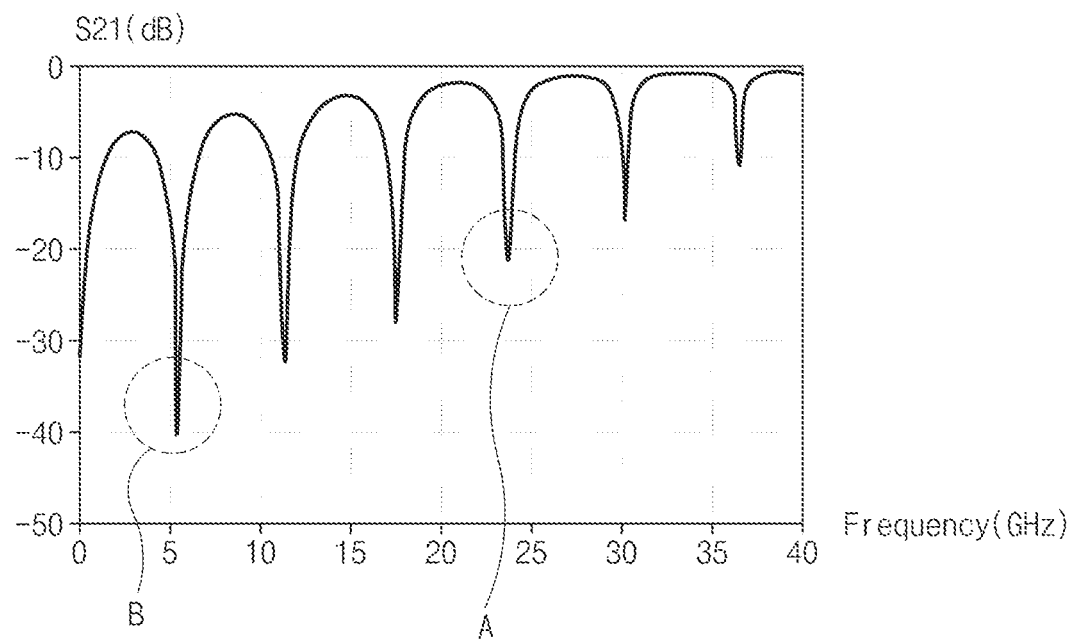
FIGS. 4 and 5 are graphs illustrating a filtering characteristic of a millimeter wave communication device according to an embodiment.
Figure 5:
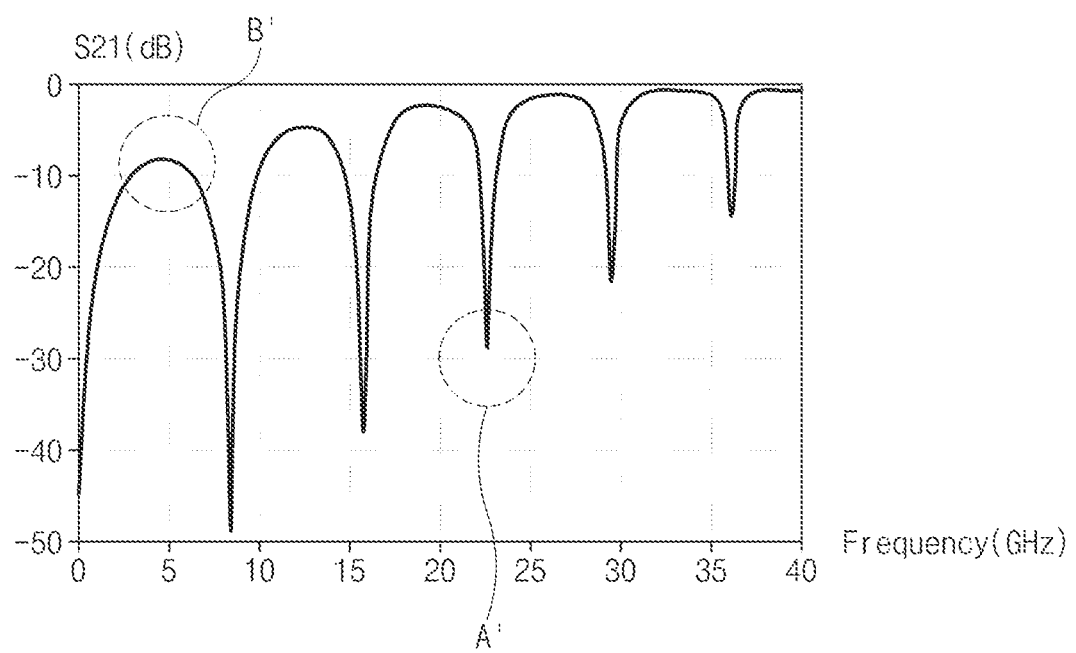

FIGS. 4 and 5 are graphs illustrating a filtering characteristic of a millimeter wave communication device according to an embodiment.

Referring to FIGS. 4 and 5, in the communication device 140, at least one of a plurality of ports connected to a plurality of antenna elements may not be connected with an antenna element.

Referring to FIG. 4, the at least one port which is not connected at the communication device 140 may be connected to a ground.

According to an embodiment, the communication device 140 may have a filtering characteristic "A" in which a signal in a frequency band ranging from 23.4 GHz to 24 GHz with regard to the 20 GHz band for 5G communication is rejected. For example, the first feed line 144-1 and the second feed line 145-1 thus coupled may have the filtering characteristic "A" in which a signal in a frequency band ranging from 23.4 GHz to 24 GHz is rejected. According to an embodiment, the communication device 140 may have a filtering characteristic "B" in which a signal in a sub-6 band is rejected.

Referring to FIG. 5, the at least one port which is not connected at the communication device 140 may be maintained at an open state.

According to an embodiment, the communication device 140 may have a filtering characteristic A' in which a signal in a frequency band ranging from 21.9 GHz to 24.5 GHz with regard to the 20 GHz band for 5G communication is rejected. For example, the first feed line 144-1 and the second feed line 145-1 thus coupled may have the filtering characteristic A' in which a signal in a frequency band ranging from 21.9 GHz to 24.5 GHz is rejected. According to an embodiment, the communication device 140 may have a filtering characteristic B' in which a signal in the sub-6 band is passed.

According to an embodiment, the communication device 140 may change a frequency band for transmission or reception by changing a state of at least one unused port (or a port not connected with an antenna element).

Figure 6:
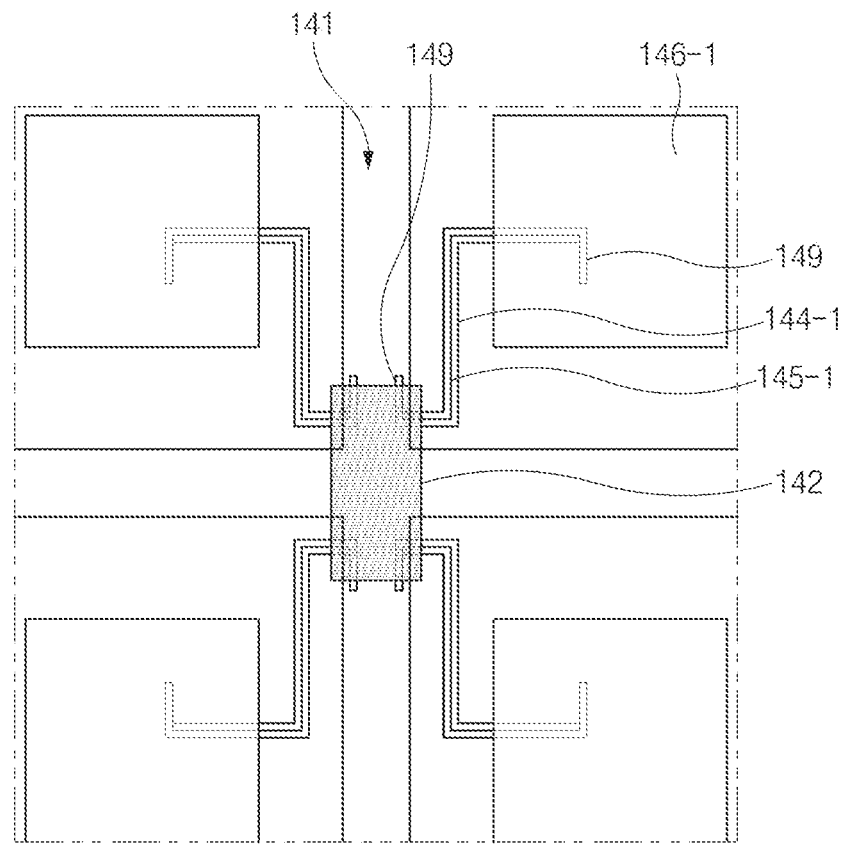
FIG. 6 is a diagram illustrating an open stub formed at a conductive line of a millimeter wave communication device according to an embodiment.

FIG. 6 is a diagram illustrating an open stub formed at a conductive line of a millimeter wave communication device according to an embodiment.

Referring to FIG. 6, an open stub may be formed at a specified location of the first feed line 144-1 of the communication device 140 or at a specified location of the second feed line 145-1 of the communication device 140. For example, the open stub may be formed at one end of the first feed line 144-1 connected with the communication IC 142. For another example, the open stub may be formed at one end of the second feed line 145-1 connected with the first antenna element 146-1.

According to an embodiment, in the case where the open stub 149 is formed at one end of the first feed line 144-1 or the second feed line 145-1 of the communication device 140, a characteristic of a signal which is transmitted and/or received through the first feed line 144-1 and the second feed line 145-1 thus coupled may be changed. According to an embodiment, in the case where the open stub 149 is formed at one end of the first feed line 144-1 or the second feed line 145-1 of the communication device 140, a length of the first feed line 144-1 and the second feed line 145-1 necessary to transmit and/or receive a signal in a similar frequency band may be reduced. For example, to reduce a length of a first portion (e.g., the first portion 144-1*a*) or a second portion (e.g., the second portion 145-1*a*), the first feed line 144-1 or the second feed line 145-1 must be positioned in a specified layer for the coupling between the first feed line 144-1 and the second feed line 145-1. The reduced length may be, for example, greater than a length of the open stub 149 formed at the second feed line 145-1.

Figure 7:
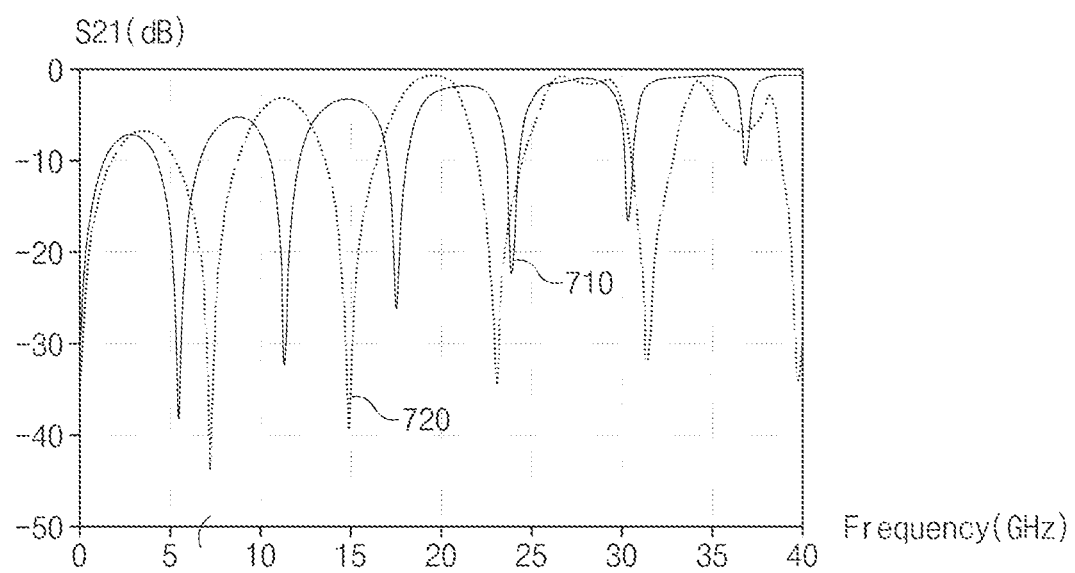
FIG. 7 is a graph illustrating a filtering characteristic in the case where an open stub is formed at a conductive line of a millimeter wave communication device according to an embodiment.

FIG. 7 is a diagram illustrating a filtering characteristic in the case where an open stub is formed at a conductive line of a millimeter wave communication device according to an embodiment.

According to an embodiment, a rejection characteristic and a filtering bandwidth of the coupled first and second feed lines 144-1 and 145-1 in a state 710 where an open stub is formed at the first feed line 144-1 or the second feed line 145-1 of the communication device 140 may be improved compared with a state 720 before an open stub is formed.

Figure 8A:
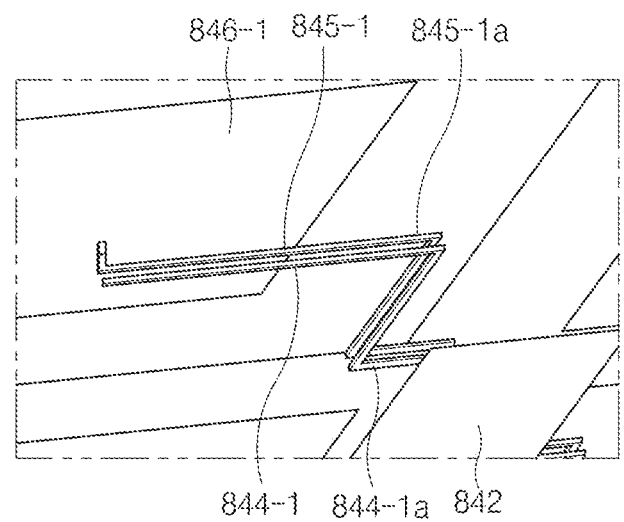
FIGS. 8A and 8B are diagrams illustrating a first feed line and a second feed line of a millimeter wave communication coupled through sides formed with a specified width according to an embodiment.
Figure 8B:
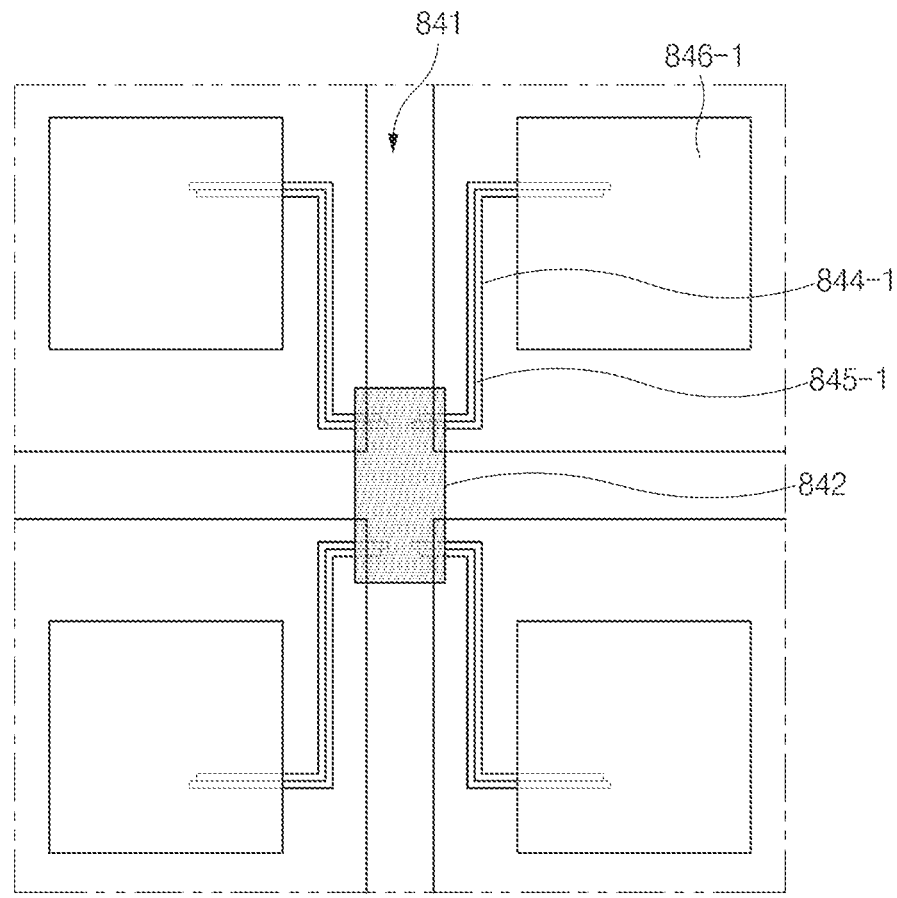

FIGS. 8A and 8B are diagrams illustrating a first feed line and a second feed line of a millimeter wave communication device coupled through sides formed with a specified width according to an embodiment.

Referring to FIGS. 8A and 8B, a first feed line 844-1 and a second feed line 845-1 may be coupled to each other.

According to an embodiment, the first feed line 844-1 may be electrically connected to a communication IC 842. The second feed line 845-1 may be electrically connected to a first antenna element 846-1. According to an embodiment, the first feed line 844-1 and the second feed line 845-1 may be positioned at an antenna PCB 841.

According to an embodiment, a first portion 844-1*a* of the first feed line 844-1 may be positioned in a first layer. The first portion 844-1*a* of the first feed line 844-1 may be formed in the first layer with a first width. According to an embodiment, a second portion 845-1*a* of the second feed line 845-1 may be positioned in a second layer, and a distance from the second layer to the first antenna element 846-1 may be smaller than a distance from the first layer to the first antenna element 846-1. The second portion 845-1*a* of the second feed line 845-1 may be formed in the second layer with a second width. The second width may be, for example, identical to the first width. According to an embodiment, the first portion 844-1*a* of the first feed line 844-1 and the second portion 845-1*a* of the second feed line 845-1 may be positioned parallel to each other. According to an embodiment, a side formed with the first width of the first portion 844-1*a* of the first feed line 844-1 may be positioned to face a side formed with the second width of the second portion 845-1*a* of the second feed line 845-1. As such, the first portion 844-1*a* of the first feed line 844-1 and the second portion 845-1*a* of the second feed line 845-1 may be coupled through the sides thus formed.

According to an embodiment, compared with a line shape, the side formed with the first width of the first feed line 844-1 and the side formed with the second width of the second feed line 845-1 may correspond to a structure which may make placement in a specified layer easy, may reduce the fraction defective on a process, and may make it possible to use a vertical space of an antenna PCB efficiently.

Figure 9A:
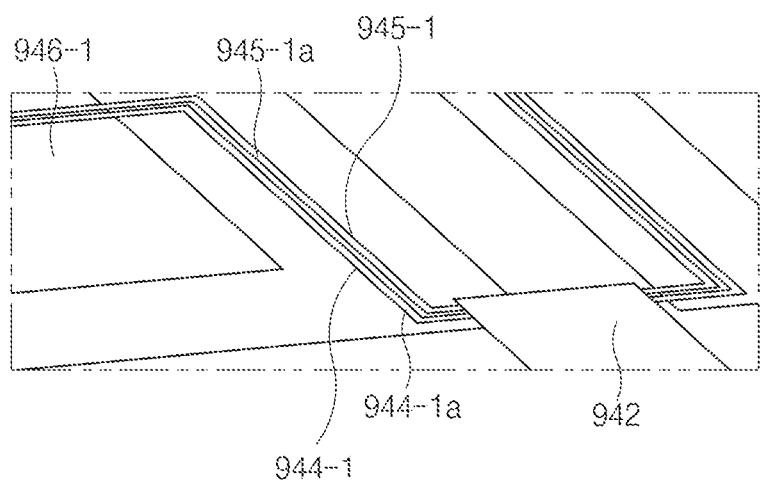
FIGS. 9A and 9B are diagrams illustrating an example where a portion of a first feed line and a second feed line of a millimeter wave communication device are positioned in the same layer according to an embodiment.
Figure 9B:
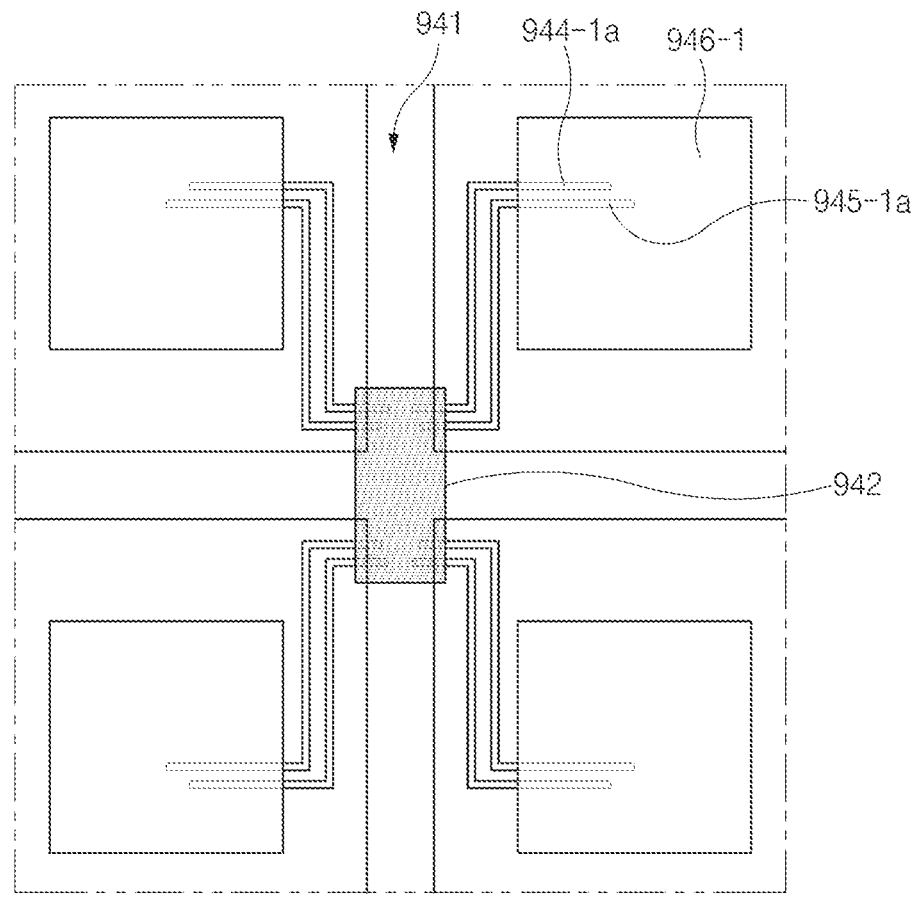

FIGS. 9A and 9B are diagrams illustrating an example where a portion of a first feed line and a second feed line of a millimeter wave communication device are positioned in the same layer according to an embodiment.

Referring to FIGS. 9A and 9B, a first feed line 944-1 and a second feed line 945-1 may be coupled to each other.

According to an embodiment, the first feed line 944-1 may be electrically connected to a communication IC 942. The second feed line 945-1 may be electrically connected to a first antenna element 946-1.

According to an embodiment, a first portion 944-1*a* of the first feed line 944-1 may be positioned in a first layer. According to an embodiment, a second portion 945-1*a* of the second feed line 945-1 may also be positioned in the first layer. For example, the second portion 945-1*a* of the second feed line 945-1 may be positioned in the same layer (e.g., the first layer) as the first portion 944-1*a* of the first feed line 944-1. According to an embodiment, when viewed from above an antenna PCB 941, the first portion 944-1*a* of the first feed line 944-1 and the second portion 945-1*a* of the second feed line 945-1 may be spaced from each other by a specified interval (or distance) and may be positioned parallel to each other.

According to an embodiment, the first portion 944-1*a* of the first feed line 944-1 may be formed in the first layer with a first height (or thickness). For another example, the second portion 945-1*a* of the second feed line 945-1 may be formed in the first layer with a second height (or thickness). The second height may be, for example, identical to the first height. According to an embodiment, a side formed to have the first height (or thickness) of the first portion 944-1*a* of the first feed line 944-1 may be positioned to face a side formed to have the second height (or thickness) of the second portion 945-1*a* of the second feed line 945-1. As such, the first portion 944-1*a* of the first feed line 944-1 and the second portion 945-1*a* of the second feed line 945-1 may be coupled through the sides thus formed.

Figure 10:
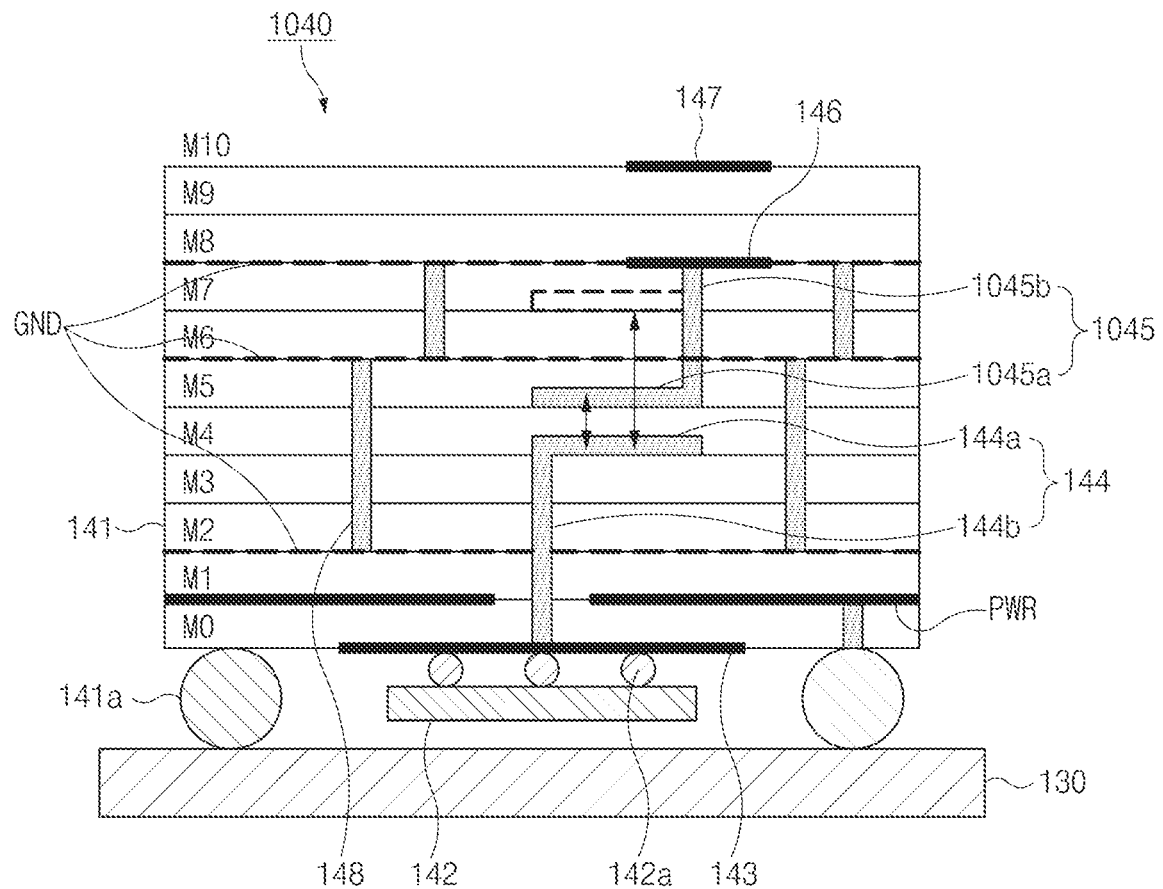
FIG. 10 is a sectional view illustrating how to adjust a coupling location of a millimeter wave communication device according to an embodiment.

FIG. 10 is a sectional view illustrating how to adjust a coupling location of a millimeter wave communication device according to an embodiment.

Referring to FIG. 10, in a communication device 1040, a layer in which a second portion 1045*a* of a second feed line 1045 is positioned may be changed.

According to an embodiment, the first feed line 144 may be electrically connected with the communication IC 142 and may be extended to penetrate the first layer M0 to the fourth layer M3, and the first portion 144*a* of the first feed line 144 may be positioned in the fifth layer M4 with a first length. According to an embodiment, the second portion 1045*a* of the second feed line 1045 may be positioned in the sixth layer M5 (or one of the sixth layer M5 to the eleventh layer M10), which is an upper layer of the fifth layer M4, with a second length so as to be coupled with the first portion 144*a* of the first feed line 144. The second length may be, for example, identical to the first length. According to an embodiment, a frequency band to be filtered may be changed by a distance between the first portion 144*a* of the first feed line 144 and the second portion 1045*a* of the second feed line 1045.

According to an embodiment, the communication device 1040 may change a frequency band targeted for transmission and/or reception by changing an interval between the first portion 144*a* of the first feed line 144 and the second portion 1045*a* of the second feed line 1045.

Figure 11:
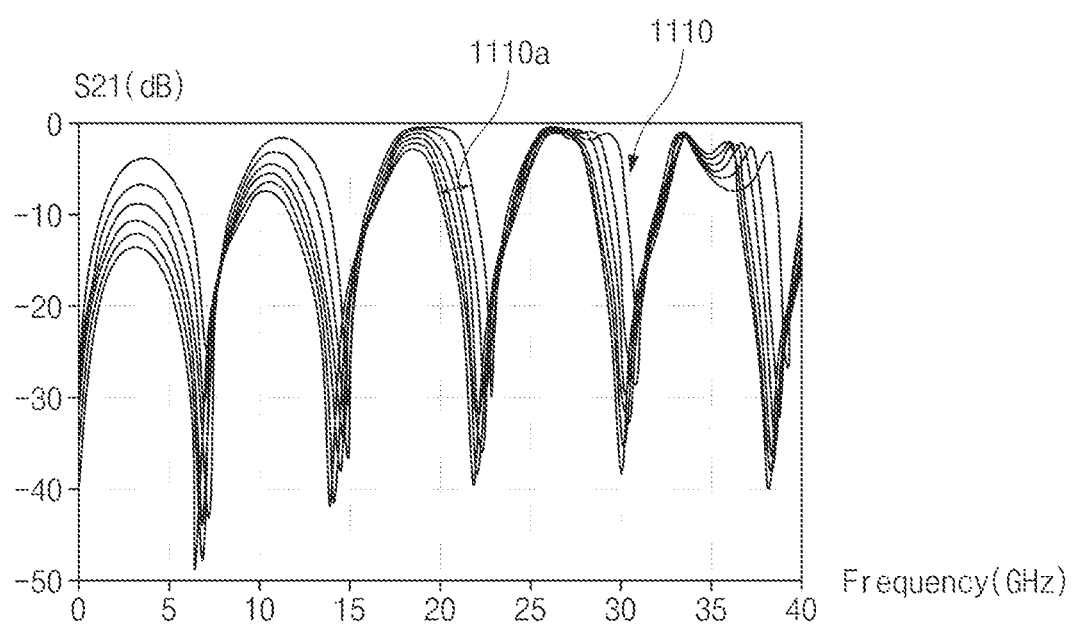
FIG. 11 is a graph illustrating a filtering characteristic upon adjusting a coupling location of a millimeter wave communication device according to an embodiment.

FIG. 11 is a graph illustrating a filtering characteristic upon adjusting a distance between a first feed line and a second feed line of a millimeter wave communication device according to an embodiment.

Referring to FIG. 11, in the case where a layer in which the second portion 1045*a* of the second feed line 1045 is changed, a filtering bandwidth and a rejection characteristic of an operating frequency (or a frequency to be filtered) 1110 of the communication device 140 may be changed (1110*a*).

Figure 12:
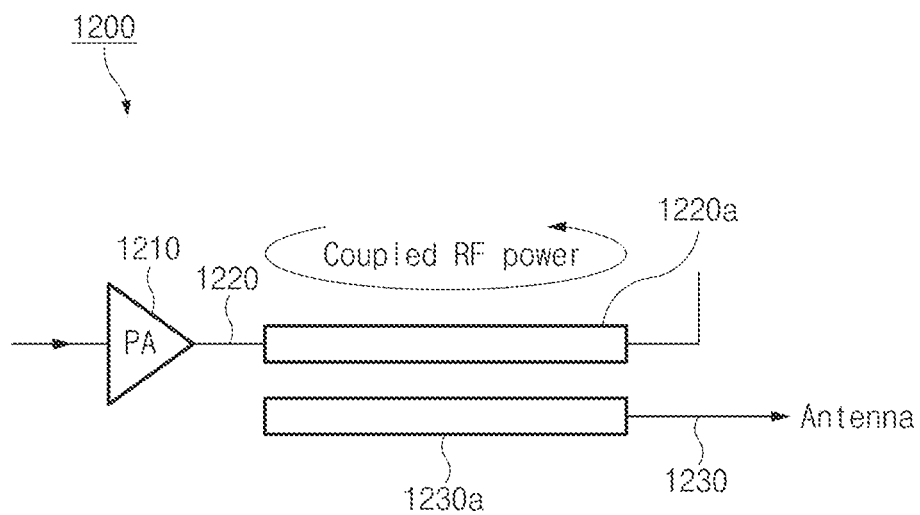
FIG. 12 is a diagram illustrating components of a millimeter wave communication device for respective functions, according to an embodiment.

FIG. 12 is a diagram illustrating components of a millimeter wave communication device for respective functions, according to an embodiment.

Referring to FIG. 12, a communication device 1200 may include an amplifier 1210, a first feed line 1220, and a second feed line 1230.

According to an embodiment, the amplifier 1210 may amplify a transmit signal by a specified magnitude. For example, the amplifier 1210 may be included in the communication IC 142 of the communication device 140 of FIG. 2.

According to an embodiment, the first feed line 1220 may be connected to an output of the amplifier 1210. For example, the first feed line 1220 may correspond to the first feed line 144 connected to the communication IC 142 of FIG. 2. According to an embodiment, the second feed line 1230 may be connected to an antenna element. For example, the second feed line 1230 may correspond to the second feed line 145 connected to the antenna element 146 of FIG. 2.

According to an embodiment, a first portion 1220*a* of the first feed line 1220 and a second portion 1230*a* of the second feed line 1230 may be coupled to each other. The first portion 1220*a* and the second portion 1230*a* thus coupled may filter a signal in a specified frequency band. For example, the first portion 1220*a* of the first feed line 1220 may correspond to the first portion 144*a* of the first feed line 144 of FIG. 2, and the second portion 1230*a* of the second feed line 1230 may correspond to the second portion 145*a* of the second feed line 145 of FIG. 2.

According to an embodiment, the first portion 1220*a* and the second portion 1230*a* thus coupled may filter a direct current component included in a transmit signal amplified by the amplifier 1210. According to an embodiment, the first portion 1220*a* of the first feed line 1220 may return a portion of a signal transmitted to an antenna as a feedback. For example, the returned or feedback portion of the signal may be used to determine whether a transmit signal is normally output. As such, the communication device 1200 (e.g., the communication device 140) may not include a filter for removing a direct current component of a transmit signal and a coupler for feeding back a portion of the transmit signal.

Figure 13:
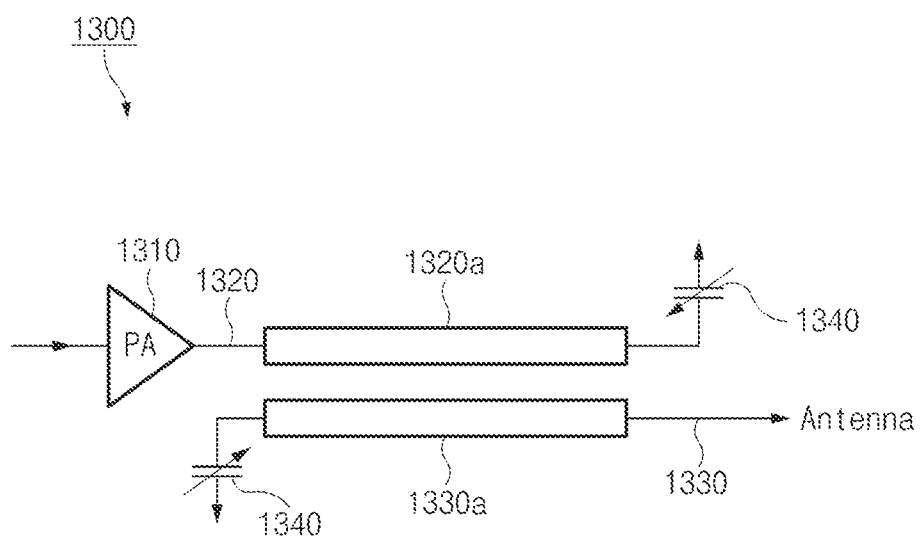
FIG. 13 is a diagram illustrating an example where a variable capacitor is installed at a millimeter wave communication device according to an embodiment.

FIG. 13 is a diagram illustrating an example where a variable capacitor is installed at a millimeter wave communication device according to an embodiment.

Referring to FIG. 13, a communication device 1300 may include an amplifier 1310, a first feed line 1320, a second feed line 1330, and at least one variable capacitor 1340. For example, the communication device 1300 may be similar to the communication device 1200 of FIG. 12.

According to an embodiment, the amplifier 1310, the first feed line 1320, or the second feed line 1330 may be similar to the amplifier 1210, the first feed line 1220, or the second feed line 1230. According to an embodiment, a first portion 1320*a* of the first feed line 1320 and a second portion 1330*a* of the second feed line 1330 may be coupled. The first portion 1320*a* and the second portion 1330*a* thus coupled may filter a signal in a specified frequency band.

According to an embodiment, the variable capacitor 1340 may be connected between the first portion 1320*a* of the first feed line 1320 and a ground. For another example, the variable capacitor 1340 may be connected between the second portion 1330*a* of the second feed line 1330 and the ground. According to an embodiment, the communication device 1300 may change a frequency band of a transmit signal or a receive signal by adjusting a capacitance of the variable capacitor 1340. The variable capacitor 1340 may be, for example, a varactor.

Figure 14:
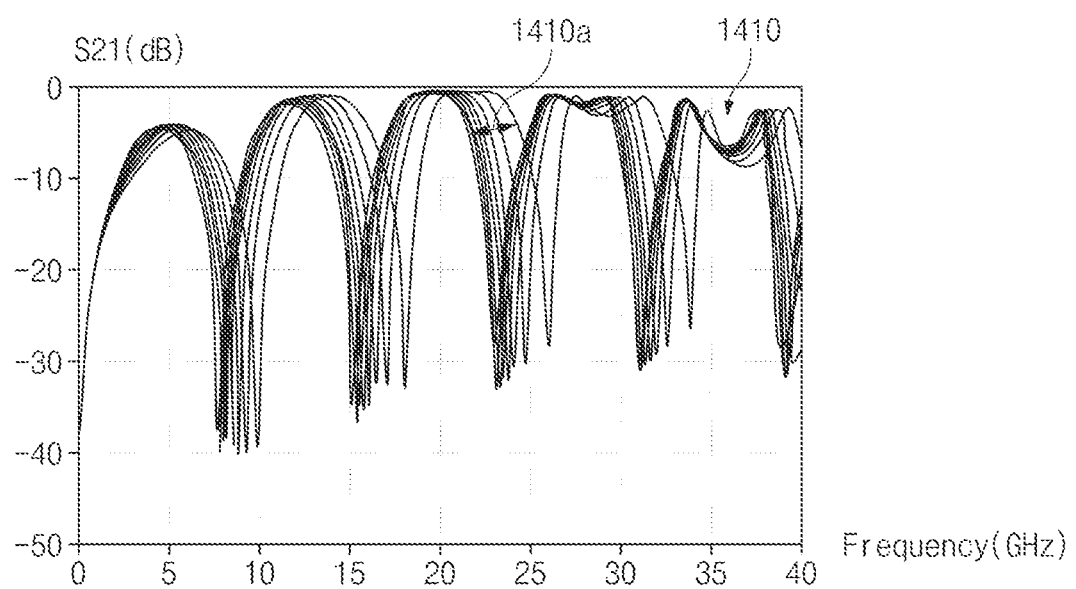
FIG. 14 is a graph illustrating a filtering characteristic of a millimeter wave communication device where a variable capacitor is installed, according to an embodiment.

FIG. 14 is a graph illustrating a filtering characteristic of a millimeter wave communication device where a variable capacitor is installed, according to an embodiment.

Referring to FIG. 14, in the case where the variable capacitor 1340 is connected to the communication device 1300, an operating frequency (or a filtering frequency) 1410 of the communication device 1300 may vary with a capacitance of the variable capacitor 1340 (refer to 1410*a*). As such, even though an operating frequency is changed due to a process variation and a process error, the operating frequency may be corrected by adjusting the capacitance of the variable capacitor 1340 installed at the communication device 1300.

An electronic device according to various embodiments of the present disclosure may include a housing that includes a first plate and a second plate facing a direction opposite the first plate, a conductive plate disposed in a first plane between the first plate and the second plate, and parallel to the second plate, a wireless communication circuit disposed within the housing and configured to transmit and/or receive a signal having a frequency ranging from 20 GHz to 100 GHz, a first electrical path having a first end electrically connected with the wireless communication circuit and a second end floated, the first electrical path including a first portion between the first end and the second end, a second electrical path having a third end electrically connected with the conductive plate and a fourth end floated, the second electrical path including a second portion between the third end and the fourth end. The first portion and the second portion may extend in parallel with each other and may provide electrical coupling between the first portion and the second portion.

The wireless communication circuit of the electronic device according to an embodiment of the present disclosure may be disposed in a second plane parallel to the second plate and may be disposed between the first plane and the first plate.

The electronic device according to an embodiment of the present disclosure may further include an antenna printed circuit board (PCB) including a first surface facing the first plate, a second surface facing the second plate, and a plurality of layers between the first surface and the second surface, wherein the wireless communication circuit may be mounted on the first surface.

The plurality of layers of the electronic device according to an embodiment of the present disclosure may include a first layer, a second layer between the first layer and the first surface, and a third layer between the first layer and the second surface, the first portion may be disposed between the first layer and the second layer, and the second portion may be disposed between the first layer and the third layer.

The conductive plate of the electronic device according to an embodiment of the present disclosure may be inserted between the third layer and the second surface.

The electronic device according to an embodiment of the present disclosure may further include a first conductive via formed to penetrate a part of the plurality of layers, which is between the first layer and the first surface, and the first conductive via may electrically connects the wireless communication circuit and the first portion.

The electronic device according to an embodiment of the present disclosure may further include a second conductive via formed to penetrate another part of the plurality of layers, which is between the first layer and the second surface, and the second conductive via may electrically connect the conductive plate and the second portion.

A millimeter wave communication device according to an embodiment of the present disclosure may include an antenna printed circuit board (PCB) including a plurality of layers, an integrated circuit (IC) that is positioned under the antenna PCB, a first feed line that is electrically connected with the IC and is extended to a first layer through one or more of the plurality of layers of the antenna PCB, a first portion of the first feed line being positioned in the first layer with a first length, a second feed line that is physically spaced from the first portion of the first feed line and is positioned in a second layer of the antenna PCB, which is an upper layer of the first layer, so as to be electrically coupled with the first portion of the first feed line, and a first antenna element that is electrically connected with the second feed line in a third layer of the antenna PCB, which is an upper layer of the second layer. The IC may transmit and/or receive a millimeter wave (mm-wave) signal using the first feed line, the second feed line, and the first antenna element.

The third layer of the millimeter wave communication device according to an embodiment of the present disclosure may be an uppermost layer of the antenna PCB.

The millimeter wave communication device according to an embodiment of the present disclosure may further include a parasitic antenna element in an uppermost layer above the third layer.

The parasitic antenna element of the millimeter wave communication device according to an embodiment of the present disclosure may be positioned at the same location as the first antenna element when viewed from above the antenna PCB.

The millimeter wave communication device according to an embodiment of the present disclosure may further include a third feed line that is electrically connected with the IC and is extended to the first layer, a third portion of the third feed line being positioned in the first layer, a fourth feed line that is positioned to be coupled with the third portion, which is positioned in the first layer, of the third feed line in the second layer, and a second antenna element that is electrically connected with the fourth feed line in the third layer.

In the case where the fourth feed line of the millimeter wave communication device according to an embodiment of the present disclosure is not electrically connected with the second antenna element, the fourth feed line may be opened or may be connected to a ground area.

In the case where the fourth feed line of the millimeter wave communication device according to an embodiment of the present disclosure is not electrically connected with the second antenna element, the fourth feed line may be electrically connected with a variable capacitor.

The variable capacitor of the millimeter wave communication device according to an embodiment of the present disclosure may be a varactor.

The second feed line of the millimeter wave communication device according to an embodiment of the present disclosure may be electrically connected with the first antenna element and may be extended to the second layer through one or more of the plurality of layers of the antenna PCB, and a second portion of the second feed line may be positioned in the second layer with a second length.

The second length of the millimeter wave communication device according to an embodiment of the present disclosure may be identical to the first length.

The millimeter wave communication device according to an embodiment of the present disclosure may further include a stub that is extended and formed from opposite ends of the second portion, which is positioned in the second layer, of the second feed line.

The first portion, which is positioned in the first layer, of the first feed line of the millimeter wave communication device according to an embodiment of the present disclosure may be formed in the first layer with a first width, and the second portion, which is positioned in the second layer, of the second feed line may be formed in the second layer with a second width.

The first width of the millimeter wave communication device according to an embodiment of the present disclosure may be identical to the second width.

The millimeter wave communication device according to an embodiment of the present disclosure may further include a plurality of grounds formed in a plurality of layers of the antenna PCB, and the plurality of grounds formed in the plurality of layers may be electrically connected to a via.

A millimeter wave communication device according to various embodiments of the present disclosure may include an antenna printed circuit board (PCB) including a plurality of layers, an integrated circuit (IC) positioned under the antenna PCB, and a first feed line electrically connected with the IC and extending to a first layer through one or more of the plurality of layers of the antenna PCB, a first portion of the first feed line being disposed in the first layer and having a first length, a second feed line disposed to be coupled with the first portion disposed in the first layer, of the first feed line in the first layer, and an antenna element electrically connected with the second feed line in a second layer of the antenna PCB, the second layer being an upper layer of the first layer. The IC may transmit and/or receive a millimeter wave (mm-wave) signal using the first feed line, the second feed line, and the antenna element.

The millimeter wave communication device according to an embodiment of the present disclosure may further include a parasitic antenna element in an uppermost layer above the second layer.

The first portion of the first feed line of the millimeter wave communication device, which is positioned in the first layer, according to an embodiment of the present disclosure is disposed to be spaced from a second portion of the second feed line, which is disposed in the first layer, by a specified interval.

The first portion of the first feed line of the millimeter wave communication device, which is disposed in the first layer, according to an embodiment of the present disclosure may be formed in the first layer having a first height, and the second portion of the second feed line, which is positioned in the first layer, may be formed in the first layer having a second height.

The first height of the millimeter wave communication device according to an embodiment of the present disclosure may be identical to the second height.

Figure 15:
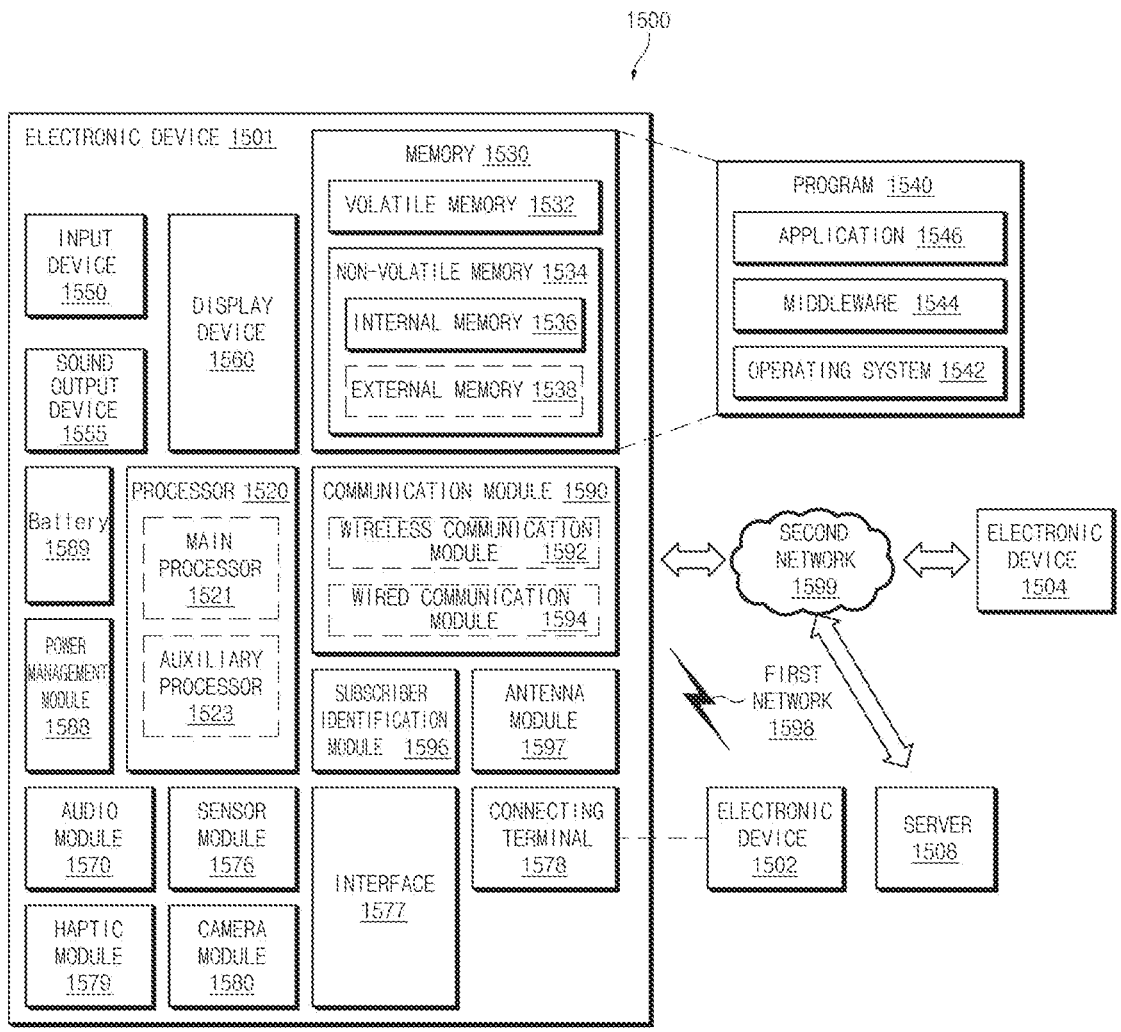
FIG. 15 illustrates a block diagram of an electronic device in a network environment according to various embodiments.

FIG. 15 is a block diagram illustrating an electronic device 1501 in a network environment 1500 according to various embodiments. Referring to FIG. 15, the electronic device 1501 in the network environment 1500 may communicate with an electronic device 1502 via a first network 1598 (e.g., a short-range wireless communication network), or an electronic device 1504 or a server 1508 via a second network 1599 (e.g., a long-range wireless communication network). According to an embodiment, the electronic device 1501 may communicate with the electronic device 1504 via the server 1508. According to an embodiment, the electronic device 1501 may include a processor 1520, memory 1530, an input device 1550, a sound output device 1555, a display device 1560, an audio module 1570, a sensor module 1576, an interface 1577, a haptic module 1579, a camera module 1580, a power management module 1588, a battery 1589, a communication module 1590, a subscriber identification module (SIM) 1596, or an antenna module 1597. In some embodiments, at least one (e.g., the display device 1560 or the camera module 1580) of the components may be omitted from the electronic device 1501, or one or more other components may be added in the electronic device 1501. In some embodiments, some of the components may be implemented as single integrated circuitry. For example, the sensor module 1576 (e.g., a fingerprint sensor, an iris sensor, or an illuminance sensor) may be implemented as embedded in the display device 1560 (e.g., a display).

The processor 1520 may execute, for example, software (e.g., a program 1540) to control at least one other component (e.g., a hardware or software component) of the electronic device 1501 coupled with the processor 1520, and may perform various data processing or computation. According to one embodiment, as at least part of the data processing or computation, the processor 1520 may load a command or data received from another component (e.g., the sensor module 1576 or the communication module 1590) in volatile memory 1532, process the command or the data stored in the volatile memory 1532, and store resulting data in non-volatile memory 1534. According to an embodiment, the processor 1520 may include a main processor 1521 (e.g., a central processing unit (CPU) or an application processor (AP)), and an auxiliary processor 1523 (e.g., a graphics processing unit (GPU), an image signal processor (ISP), a sensor hub processor, or a communication processor (CP)) that is operable independently from, or in conjunction with, the main processor 1521. Additionally or alternatively, the auxiliary processor 1523 may be adapted to consume less power than the main processor 1521, or to be specific to a specified function. The auxiliary processor 1523 may be implemented as separate from, or as part of the main processor 1521.

The auxiliary processor 1523 may control at least some of functions or states related to at least one component (e.g., the display device 1560, the sensor module 1576, or the communication module 1590) among the components of the electronic device 1501, instead of the main processor 1521 while the main processor 1521 is in an inactive (e.g., sleep) state, or together with the main processor 1521 while the main processor 1521 is in an active state (e.g., executing an application). According to an embodiment, the auxiliary processor 1523 (e.g., an image signal processor or a communication processor) may be implemented as part of another component (e.g., the camera module 1580 or the communication module 1590) functionally related to the auxiliary processor 1523.

The memory 1530 may store various data used by at least one component (e.g., the processor 1520 or the sensor module 1576) of the electronic device 1501. The various data may include, for example, software (e.g., the program 1540) and input data or output data for a command related thereto. The memory 1530 may include the volatile memory 1532 or the non-volatile memory 1534.

The program 1540 may be stored in the memory 1530 as software, and may include, for example, an operating system (OS) 1542, middleware 1544, or an application 1546.

The input device 1550 may receive a command or data to be used by other component (e.g., the processor 1520) of the electronic device 1501, from the outside (e.g., a user) of the electronic device 1501. The input device 1550 may include, for example, a microphone, a mouse, a keyboard, or a digital pen (e.g., a stylus pen).

The sound output device 1555 may output sound signals to the outside of the electronic device 1501. The sound output device 1555 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1560 may visually provide information to the outside (e.g., a user) of the electronic device 1501. The display device 1560 may include, for example, a display, a hologram device, or a projector and control circuitry to control a corresponding one of the display, hologram device, and projector. According to an embodiment, the display device 1560 may include touch circuitry adapted to detect a touch, or sensor circuitry (e.g., a pressure sensor) adapted to measure the intensity of force incurred by the touch.

The audio module 1570 may convert a sound into an electrical signal and vice versa. According to an embodiment, the audio module 1570 may obtain the sound via the input device 1550, or output the sound via the sound output device 1555 or a headphone of an external electronic device (e.g., an electronic device 1502) directly (e.g., wiredly) or wirelessly coupled with the electronic device 1501.

The sensor module 1576 may detect an operational state (e.g., power or temperature) of the electronic device 1501 or an environmental state (e.g., a state of a user) external to the electronic device 1501, and then generate an electrical signal or data value corresponding to the detected state. According to an embodiment, the sensor module 1576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1577 may support one or more specified protocols to be used for the electronic device 1501 to be coupled with the external electronic device (e.g., the electronic device 1502) directly (e.g., wiredly) or wirelessly. According to an embodiment, the interface 1577 may include, for example, a high definition multimedia interface (HDMI), a universal serial bus (USB) interface, a secure digital (SD) card interface, or an audio interface.

A connecting terminal 1578 may include a connector via which the electronic device 1501 may be physically connected with the external electronic device (e.g., the electronic device 1502). According to an embodiment, the connecting terminal 1578 may include, for example, a HDMI connector, a USB connector, a SD card connector, or an audio connector (e.g., a headphone connector).

The haptic module 1579 may convert an electrical signal into a mechanical stimulus (e.g., a vibration or a movement) or electrical stimulus which may be recognized by a user via his tactile sensation or kinesthetic sensation. According to an embodiment, the haptic module 1579 may include, for example, a motor, a piezoelectric element, or an electric stimulator.

The camera module 1580 may capture a still image or moving images. According to an embodiment, the camera module 1580 may include one or more lenses, image sensors, image signal processors, or flashes.

The power management module 1588 may manage power supplied to the electronic device 1501. According to one embodiment, the power management module 1588 may be implemented as at least part of, for example, a power management integrated circuit (PMIC).

The battery 1589 may supply power to at least one component of the electronic device 1501. According to an embodiment, the battery 1589 may include, for example, a primary cell which is not rechargeable, a secondary cell which is rechargeable, or a fuel cell.

The communication module 1590 may support establishing a direct (e.g., wired) communication channel or a wireless communication channel between the electronic device 1501 and the external electronic device (e.g., the electronic device 1502, the electronic device 1504, or the server 1508) and performing communication via the established communication channel. The communication module 1590 may include one or more communication processors that are operable independently from the processor 1520 (e.g., the application processor (AP)) and supports a direct (e.g., wired) communication or a wireless communication. According to an embodiment, the communication module 1590 may include a wireless communication module 1592 (e.g., a cellular communication module, a short-range wireless communication module, or a global navigation satellite system (GNSS) communication module) or a wired communication module 1594 (e.g., a local area network (LAN) communication module or a power line communication (PLC) module). A corresponding one of these communication modules may communicate with the external electronic device via the first network 1598 (e.g., a short-range communication network, such as Bluetooth™, wireless-fidelity (Wi-Fi) direct, or infrared data association (IrDA)) or the second network 1599 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1592 may identify and authenticate the electronic device 1501 in a communication network, such as the first network 1598 or the second network 1599, using subscriber information (e.g., international mobile subscriber identity (IMSI)) stored in the subscriber identification module 1596.

The antenna module 1597 may transmit or receive a signal or power to or from the outside (e.g., the external electronic device) of the electronic device 1501. According to an embodiment, the antenna module 1597 may include an antenna including a radiating element composed of a conductive material or a conductive pattern formed in or on a substrate (e.g., PCB). According to an embodiment, the antenna module 1597 may include a plurality of antennas. In such a case, at least one antenna appropriate for a communication scheme used in the communication network, such as the first network 1598 or the second network 1599, may be selected, for example, by the communication module 1590 (e.g., the wireless communication module 1592) from the plurality of antennas. The signal or the power may then be transmitted or received between the communication module 1590 and the external electronic device via the selected at least one antenna. According to an embodiment, another component (e.g., a radio frequency integrated circuit (RFIC)) other than the radiating element may be additionally formed as part of the antenna module 1597.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1501 and the external electronic device 1504 via the server 1508 coupled with the second network 1599. Each of the electronic devices 1502 and 1504 may be a device of a same type as, or a different type, from the electronic device 1501. According to an embodiment, all or some of operations to be executed at the electronic device 1501 may be executed at one or more of the external electronic devices 1502, 1504, or 1508. For example, if the electronic device 1501 should perform a function or a service automatically, or in response to a request from a user or another device, the electronic device 1501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1501. The electronic device 1501 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1540) including one or more instructions that are stored in a storage medium (e.g., internal memory 1536 or external memory 1538) that is readable by a machine (e.g., the electronic device 1501). For example, a processor (e.g., the processor 1520) of the machine (e.g., the electronic device 1501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the present disclosure has been illustrated and described with reference to various example embodiments thereof, it will be understood by those skilled in the art that various changes in form and details may be made therein without departing from the spirit and scope of the present disclosure as defined, for example, in the appended claims, and their equivalents.

What is claimed is:

1. An electronic device comprising:
a housing including a first plate and a second plate;
a printed circuit board (PCB) including a plurality of layers and at least one antenna disposed between the first plate and the second plate;
a conductive plate disposed in a first plane of the PCB between at least the first plate and the second plate;
a wireless communication circuit disposed within the housing, and configured to transmit and/or receive a signal;
a first electrical path having a first end electrically connected with the wireless communication circuit and a second end floated in the PCB,
wherein the first electrical path includes a first portion between the first end and the second end; and
a second electrical path having a third end electrically connected with the conductive plate and a fourth end floated in the PCB,
wherein the second electrical path includes a second portion between the third end and the fourth end,
wherein the first portion of the first electrical path and the second portion of the second electrical path are spaced from each other by one or more layers of the plurality of layers of the PCB, at least partially extend in parallel with each other, and provide electrical coupling between at least the first portion and the second portion, and
wherein the electronic device further comprises:
a first ground layer disposed in a layer of the PCB between the first portion and the wireless communication circuit;
a second ground layer disposed in a layer of the PCB between the second portion and the conductive plate; and
a plurality of vias disposed on multiple sides of the first and second portions and electronically connecting the first ground layer to the second ground layer.

2. The electronic device of claim 1, wherein the wireless communication circuit is disposed in a second plane parallel to the second plate and between the first plane and the first plate.

3. The electronic device of claim 1, wherein:
the PCB includes a first surface facing the first plate, a second surface facing the second plate, and comprising the plurality of layers are disposed between the first surface and the second surface,
wherein the wireless communication circuit is mounted on the first surface.

4. The electronic device of claim 3, wherein the plurality of layers includes a first layer, a second layer disposed between the first layer and the first surface, and a third layer disposed between the first layer and the second surface,
wherein the first portion is disposed between the first layer and the second layer, and
wherein the second portion is disposed between the first layer and the third layer.

5. The electronic device of claim 4, wherein the conductive plate is disposed between the third layer and the second surface.

6. The electronic device of claim 5, further comprising:
a first conductive via penetrating a part of the plurality of layers between the first layer and the first surface,
wherein the first conductive via electrically connects the wireless communication circuit and the first portion.

7. The electronic device of claim 6, further comprising:
a second conductive via penetrating another part of the plurality of layers between the first layer and the second surface,
wherein the second conductive via electrically connects the conductive plate and the second portion.

8. A millimeter wave communication device of an electronic device, comprising:
an antenna printed circuit board (PCB) including a plurality of layers;
an integrated circuit (IC) positioned under at least the antenna PCB;
a first feed line electrically connected with the IC and extending to a first layer of the plurality of layers through one or more of the plurality of layers of the antenna PCB, wherein a first portion of the first feed line is disposed in the first layer;
a second feed line including a second portion spaced from the first portion of the first feed line and disposed in a second layer of the plurality of layers of the antenna PCB so as to be electrically coupled with the first portion of the first feed line, the second layer being an upper layer of the first layer; and
a first antenna element electrically connected with the second feed line in a third layer of the antenna PCB, the third layer being an upper layer of the second layer,
wherein the IC is configured to transmit and/or receive a signal by way of the first feed line, the second feed line, and the first antenna element, and
wherein the millimeter wave communication device further comprises:
a first ground layer disposed in a layer of the PCB between the first portion and the IC;
a second ground layer disposed in a layer of the PCB between the second portion and the first antenna element; and
a plurality of vias disposed on multiple sides of the first and second portions and electronically connecting the first ground layer to the second ground layer.

9. The millimeter wave communication device of claim 8, further comprising:
a parasitic antenna element disposed in an uppermost layer above the third layer.

10. The millimeter wave communication device of claim 8, further comprising:
a third feed line electrically connected with the IC and extending to the first layer, wherein a third portion of the third feed line is disposed in the first layer;
a fourth feed line disposed to be coupled with the third portion, which is positioned in the first layer, of the third feed line in the second layer; and
a second antenna element electrically connected with the fourth feed line in the third layer.

11. The millimeter wave communication device of claim 8, further comprising:
a third feed line electrically connected with the IC and extending to the first layer, wherein a third portion of the third feed line is disposed in the first layer; and
a fourth feed line disposed to be coupled with the third portion, which is positioned in the first layer, of the third feed line in the second layer, wherein the fourth feed line is configured to be opened or to be connected to a ground area.

12. The millimeter wave communication device of claim 8, further comprising:
a third feed line electrically connected with the IC and extending to the first layer, wherein a third portion of the third feed line is disposed in the first layer; and
a fourth feed line disposed to be coupled with the third portion, which is positioned in the first layer, of the third feed line in the second layer, wherein the fourth feed line is configured to be electrically connected with a variable capacitor.

13. The millimeter wave communication device of claim 12, wherein the variable capacitor comprises a varactor.

14. The millimeter wave communication device of claim 8, wherein the second feed line is electrically connected with the first antenna element and extends to the second layer through one or more of the plurality of layers of the antenna PCB, and
wherein the second portion of the second feed line is disposed in the second layer.

15. The millimeter wave communication device of claim 14, further comprising:
a stub extending from and formed at opposite ends of the second portion, which is positioned in the second layer, of the second feed line.

16. The millimeter wave communication device of claim 8, wherein the first portion and the second portion are configured to filter a portion of a signal which is transmitted and/or received through the first antenna element, and
wherein a frequency band of the signal to be filtered is determined according to a length of the first portion and the second portion thus coupled.

17. The millimeter wave communication device of claim 8, wherein the first portion, which is positioned in the first layer, of the first feed line is formed in the first layer and having a first width, and
wherein the second portion, which is positioned in the second layer, of the second feed line is formed in the second layer and has a second width.

18. The millimeter wave communication device of claim 17, wherein the first width and the second width are identical.

19. A millimeter wave communication device of an electronic device, comprising:
an antenna printed circuit board (PCB) including a plurality of layers;
an integrated circuit (IC) disposed under the antenna PCB;
a first feed line electrically connected with the IC and extending to a first layer of the plurality of layers through one or more of the plurality of layers of the antenna PCB,
wherein a first portion of the first feed line is disposed in the first layer;
a second feed line including a second portion disposed to be coupled with the first portion, positioned in the first layer, of the first feed line in the first layer;

an antenna element electrically connected with the second feed line in a second layer of the antenna PCB, the second layer being an upper layer of the first layer, wherein the IC is configured to transmit and/or receive a signal by way of the first feed line, the second feed line, and the antenna element, wherein an open stub is formed proximate to at least one end of the first feed line and the second feed line, and wherein the millimeter wave communication device further comprises:

a first ground layer disposed in a layer of the antenna PCB between the first portion and the IC;

a second ground layer disposed in a layer of the antenna PCB between the second layer of the antenna PCB and the antenna element; and a plurality of vias disposed on multiple sides of the first portion and electronically connecting the first ground layer to the second ground layer.

20. The millimeter wave communication device of claim 19, wherein the first portion, which is disposed in the first layer, of the first feed line is disposed to be spaced from the second portion, which is positioned in the first layer, of the second feed line by a specified interval.

* * * * *